(12) United States Patent
Young et al.

(10) Patent No.: US 12,315,711 B2
(45) Date of Patent: May 27, 2025

(54) TECHNIQUES FOR GENERATING AND PERFORMING ANALYTICAL METHODS

(71) Applicant: WATERS TECHNOLOGIES IRELAND LIMITED, Dublin (IE)

(72) Inventors: Phillip Young, Stockport (GB); Matthew Wherry, Wilmslow (GB); Kendon S. Graham, Millis, MA (US); Alexander Hooper, Stoke-on-Trent (GB); Christopher Carver, Northwich (GB)

(73) Assignee: Waters Technologies Ireland Limited, Dublin (IE)

( * ) Notice: Subject to any disclaimer, the term of this patent is extended or adjusted under 35 U.S.C. 154(b) by 1418 days.

(21) Appl. No.: 16/577,279

(22) Filed: Sep. 20, 2019

(65) Prior Publication Data

US 2020/0098552 A1   Mar. 26, 2020

Related U.S. Application Data

(60) Provisional application No. 62/733,941, filed on Sep. 20, 2018.

(51) Int. Cl.
*H01J 49/00*     (2006.01)
*G01N 30/72*     (2006.01)
(Continued)

(52) U.S. Cl.
CPC .......... *H01J 49/0027* (2013.01); *G01N 30/72* (2013.01); *G01N 30/8665* (2013.01); *G01N 30/88* (2013.01); *G01N 35/00871* (2013.01); *G01R 31/00* (2013.01); *H01J 49/00* (2013.01); *H01J 49/0009* (2013.01); *G01N 30/7233* (2013.01)

(58) Field of Classification Search
CPC .... H01J 49/0027; H01J 49/00; H01J 49/0009; G01N 30/72; G01N 30/8665; G01N 30/88; G01N 35/00871; G01N 30/7233; G01N 2035/00881; G01N 2030/8804; G01R 31/00
USPC .................................... 250/281, 282; 702/85
See application file for complete search history.

(56) References Cited

U.S. PATENT DOCUMENTS

2017/0067922 A1* 3/2017 Antoni ............... G01N 35/1072
2017/0115261 A1* 4/2017 Matsuo .............. G01N 35/0092

FOREIGN PATENT DOCUMENTS

EP      1260818 A1    11/2002

OTHER PUBLICATIONS

International Search Report and Written Opinion for International application No. PCT/IB2019/057996, mailed on Dec. 2, 2019, 9 pages.
(Continued)

*Primary Examiner* — Michael Maskell
(74) *Attorney, Agent, or Firm* — Goodwin Procter LLP

(57) ABSTRACT

Techniques and apparatus for are described. In one embodiment, for example, an apparatus may include at least one memory, and logic coupled to the at least one memory. The logic may be configured to perform an analytical service on a primary analytical device, receive acceptance of the analytical service, and generate an analytical services package for the analytical service, the analytical services package configured to facilitate performance of the analytical service on a client analytical device. Other embodiments are described.

17 Claims, 29 Drawing Sheets

(51) Int. Cl.
*G01N 30/86* (2006.01)
*G01N 30/88* (2006.01)
*G01N 35/00* (2006.01)
*G01R 31/00* (2006.01)

(56) References Cited

OTHER PUBLICATIONS

Communication Pursuant to Article 94(3) EPC for EP Patent Application No. 19780024.6, mailed Jun. 27, 2023.

* cited by examiner

*FIG. 9S*

TECHNIQUES FOR GENERATING AND PERFORMING ANALYTICAL METHODS

CROSS-REFERENCE TO RELATED APPLICATIONS

This application claims the benefit of and priority to U.S. Provisional Patent Application No. 62/733,941, filed on Sep. 20, 2018, the entire contents of which are incorporated by reference.

TECHNICAL FIELD

Embodiments herein generally relate to managing processes for analytical devices, and, more particularly, to processes for generating methods configured to be performed by analytical devices.

BACKGROUND

Mass spectrometry (MS) is an effective tool for the characterization of compounds in a wide range of disciplines, including proteomics, toxicology, food and environment (F&E), pharmaceuticals, and clinical research. The coupling of chromatography techniques with mass spectrometry combines the resolving power of chromatography with the detection specificity of MS. For example, a liquid chromatography-MS (LC-MS) system interfaces a liquid chromatography (LC) system with a mass analyzer (i.e., a mass spectrometer (MS) and/or an ion-mobility spectrometer (IMS)).

Conventional MS systems require experienced users having technical proficiency with specific instruments and analysis techniques. In addition, MS analysis results typically require long turn-around-times. Accordingly, MS analyses are generally limited to specialized operating environments. As a result, although MS provides effective, accurate analyses, use of conventional MS systems has not become widespread, particularly for routine applications in time-sensitive and/or high-production environments such as in vitro diagnostics (IVD) or other clinical applications.

SUMMARY

In accordance with various aspects of the described embodiments is an apparatus that may include at least one memory and logic coupled to the at least one memory. The logic may operate to perform an analytical service on a primary analytical device, receive acceptance of the analytical service, and generate an analytical services package for the analytical service, the analytical services package configured to facilitate performance of the analytical service on a client analytical device.

In some embodiments of the apparatus, at least a portion of the analytical services package is immutable. In various embodiments of the apparatus, the primary analytical device may include a liquid chromatography (LC) device. In some embodiments of the apparatus, the primary analytical device may include a mass spectrometer (MS) device. In some embodiments of the apparatus, the analytical services package may include a status of the analytical service. In exemplary embodiments of the apparatus, the analytical services package may include a security level of an operator permitted to run the analytical service. In various embodiments of the apparatus, the logic may operate to access the analytical services package, and provide the analytical services package to the client analytical device for performance of the analytical service on the client device. In some embodiments of the apparatus, the logic may operate to set an acceptance variable of the analytical services package to an accepted value responsive to acceptance of the analytical services package. In various embodiments of the apparatus, the logic may operate to associate the analytical services package with a regulatory certificate. In some embodiments of the apparatus, the analytical services package may include an analytical method and process information associated with performing the analytical method.

In accordance with some aspects of the described embodiments is a method that may include performing an analytical service on a primary analytical device, receiving acceptance of the analytical service, and generating an analytical services package for the analytical service, the analytical services package configured to facilitate performance of the analytical service on a client analytical device.

In some embodiments of the method, at least a portion of the analytical services package is immutable. In some embodiments of the method, the primary analytical device may include a liquid chromatography (LC) device. In some embodiments of the method, the primary analytical device may include a mass spectrometer (MS) device. In some embodiments of the method, the analytical services package may include a status of the analytical service. In some embodiments of the method, the analytical services package may include a security level of an operator permitted to run the analytical service. In some embodiments of the method, the method may include accessing the analytical services package, and providing the analytical services package to the client analytical device for performance of the analytical service on the client device. In some embodiments of the method, the method may include setting an acceptance variable of the analytical services package to an accepted value responsive to acceptance of the analytical services package. In some embodiments of the method, the method may include associating the analytical services package with a regulatory certificate. In some embodiments of the method, the analytical services package may include an analytical method and process information associated with performing the analytical method.

DETAILED DESCRIPTION

Figure 1:
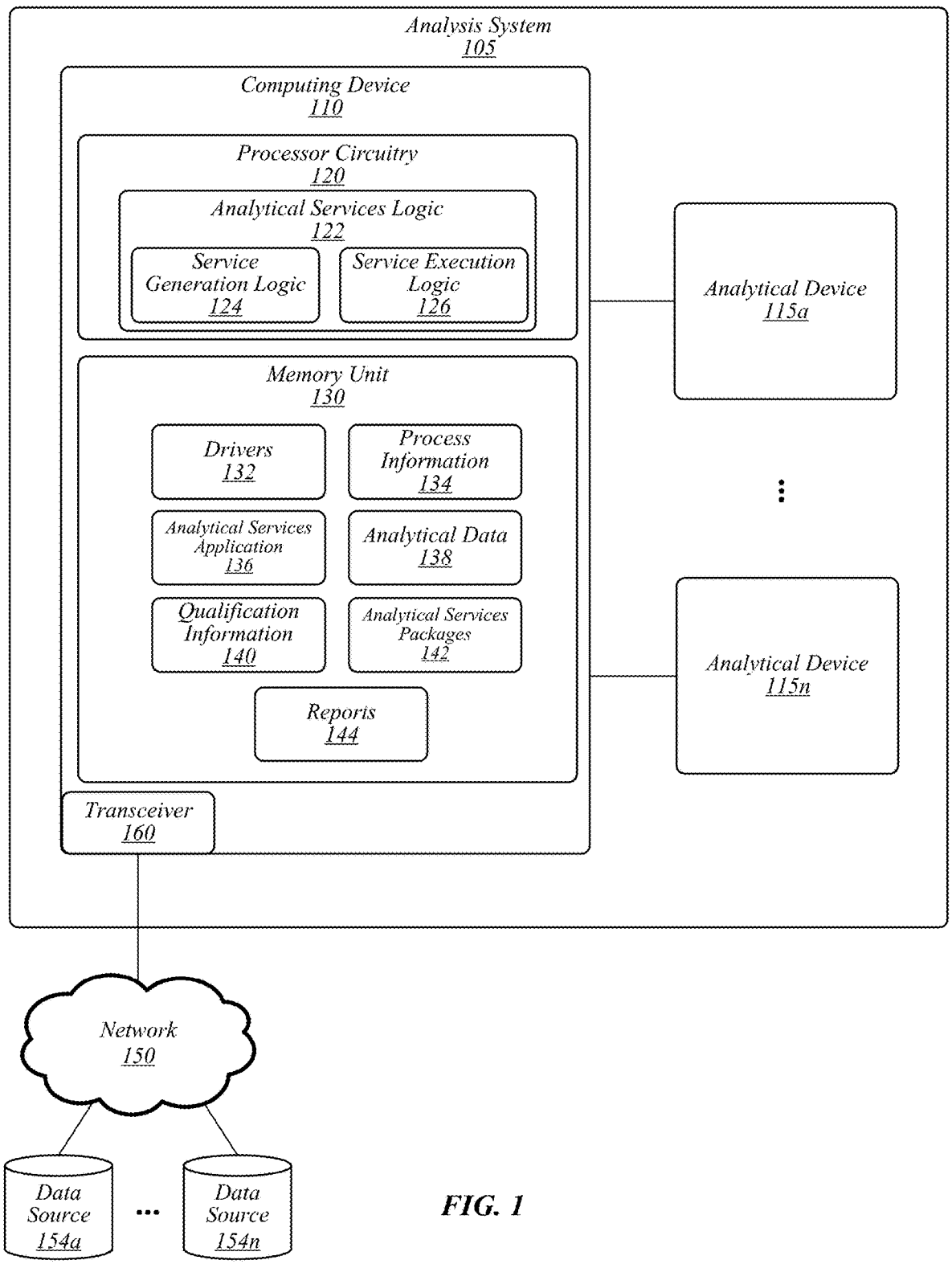
FIG. 1 illustrates an embodiment of a first operating environment.

Various embodiments may generally be directed toward systems, methods, and/or apparatus for generating, controlling, processing, operating, or otherwise managing analytical services for analytical systems. In some embodiments, analytical services may be generated using a primary analytical system for use on a client analytical system. In exemplary embodiments, an analytical service may include a process and any process information (for instance, parameters, settings, thresholds, limits, and/or the like) required to perform a process, method, analysis, test, and/or the like on an analytical device. In some embodiments, an analytical service may be developed, refined, tuned, and/or the like using a primary analytical system. The primary analytical system may be used to determine the correct methods, steps, sequences, parameters, and/or the like for the analytical service. Once the analytical service operates correctly (or otherwise as desired) on the primary analytical system, an analytical service package may be generated for use by client analytical systems. In various embodiments, at least a portion of the analytical service package may be immutable or non-modifiable. A client analytical system may access and execute ("run" or "play") the analytical service package to perform the analytical service as specified by the analytical process package.

For example, in some embodiments, an analytical system may include a liquid-chromatography (LC)-mass spectrometry (MS) system. LC-MS services may be developed and refined in a primary LC-MS system. Once the correct service parameters have been determined and the performance of the service established, the service may be exported as an analytical services package or process package. For example, the service may include performing LC-MS on a particular class of compounds. On export, many common settings (for instance, plate size, sample location order, which plates are used when running the, and/or the like) may be specified, and the service may be packaged for routine use by a client LC-MS system. In some embodiments, the client LC-MS system may include or may be operably coupled to a computing device. The computing device may execute an analytical services application operative to execute the service specified by an analytical service package. In various embodiments, the analytical services application may operate to execute the analytical services package as a read-only (or at least partially read-only) package. Accordingly, the analytical services application may operate as a package "player" operative to "run" or "play" the service specified in the analytical services package using the client LC-MS and associated computing hardware/software. In some embodiments, analytical services packages may include a status characteristic, for example, indicating their approval status (for instance, for performance evaluation only, for clinical use, for research use only, approved by a regulatory body (for example, the Food and Drug Administration (FDA))).

In various embodiments, a client analytical system may be a basic version of an analytical system (for instance, compared with a full-fledged primary analytical system) optimized for running the same method many times, improving user experience, reduction of use error, reduction of data entry, user interaction, and touch time, and/or the like. For example, the client analytical system and/or client analytical services application may not have the same number of options or configurations as a full-fledged primary analytical system. In some embodiments, a client analytical services application may be or may include a web application ("web app" or "app"), remote web client, and/or the like. Accordingly, in some embodiments, a client analytical system may take advantage of the fact that many parameters are preset during the generation of an analytical services package to optimize workflow, minimize operator interaction, and, therefore, reduce the scope for operator error. In some embodiments, a client analytical system may be or may include different operating characteristics than a primary analytical system. For example, a client analytical system may require different reagent volumes, parameter volumes, sample run times, and/or the like. In some embodiments, an analytical services package may include information to allow a process thereof to be performed on a different client analytical system. For instance, an analytical services package may include information to translate a method from the primary analytical system to various types of client analytical systems.

Analytical services according to some embodiments may provide multiple technological advantages and technical features, including improvements to computing technology, over conventional systems and methods. For instance, some embodiments may allow for non-expert users to perform analyses using analytical devices that must be performed by specialist operators using conventional technology. For example, the use of LC-MS for applications associated with clinical diagnostics (CDX) has been growing steadily. However, expansion of LC-MS outside of highly-specialized areas has been limited. Accordingly, some embodiments may provide new processes, software tools, and analytical device systems that will satisfy the core applications needs of clinical diagnostics laboratories and deliver an enhanced user experience (UX) to further the adoption of LC-MS. For example, some embodiments may provide a user interface that focuses upon the execution of analytical tests, and will be designed to provide an intuitive, simplified workflow meaning that non-expert users in the will be able to operate analysis systems, such as LC-MS systems.

The expansion of LC-MS in the clinical environment has been limited because the clinical diagnostics environment places specific demands upon LC-MS products and the software tools associated with them that have not been met by conventional systems. In particular, conventional LC-MS is widely regarded as a complex technique to operate in a clinical laboratory due to the need for skilled operators, which has been a major barrier to widespread adoption. Accordingly, some embodiments may provide an efficient interface and services to facilitate the use of LC-MS in a routine testing environment.

For example, the needs of non-expert users may be addressed in such a way that the LC-MS systems can be used to generate and report results with no or reduced specialist knowledge of the technology. In another example, the modern clinical laboratory is a highly automated environment, therefore some embodiments may facilitate integration of an LC-MS with laboratory information (management) systems (LIS or LIMS), as well as a variety of sample handling tools to improve overall efficiency of analysis and reduce error rates associated with manual transcription of data or sample handling.

Furthermore, some embodiments may support additional requirements that must be considered for in vitro applications. For example, when LC-MS systems which, whether used alone or in combination, are intended by the manufacturer for the in-vitro examination of specimens to provide information for diagnostic, monitoring, or compatibility purposes used to generate data that will influence a treatment decision, they are classified as an in vitro diagnostic (IVD) medical device. Accordingly, they are subject to regulatory controls that are intended to safeguard the health and safety of patients, users and other persons by ensuring that manufacturers of IVD medical devices follow certain standards (for instance, FDA within the United States, the Medicines and Healthcare Products Regulatory Agency (MHRA) in the United Kingdom, and the European Medicines Agency (EMA) within the European Union) during design, manufacture, use, and/or marketing.

As described in more detail below, some embodiments may provide analytical devices, applications, processes, and/or the like that may be used as a component of an IVD medical device, such as an LC-MS IVD medical device. For example, some embodiments may allow for clinical laboratories (for instance, hospitals, contract testing, and/or the like) to develop their own laboratory developed tests (LDT) using an LC-MS IVD device. In another example, research organizations, third parties, and/or other entities may use analytical devices, applications, processes, and/or the like according to some embodiments to implement, obtain regulatory approval, commercialize, and/or the like their own Class II medical devices using LC-MS IVD medical devices (for example, using documentation provided using processes according to some embodiments). In a further example, some embodiments may allow for an entity (for instance, a laboratory) to develop and commercialize diagnostic tests that may be run on client instruments in the field or as part of a reagent rental program. Embodiments are not limited in this context. In particular, although IVD medical devices (and LC-MS IVD medical devices in particular) are described in some examples, embodiments are not so limited, as any application capable of operating according to some embodiments is contemplated herein. For example, some embodiments may provide analytical devices, applications, processes, and/or the like for pharmaceuticals, food and environment (F&E), toxicology (for example, forensic toxicology), and/or the like.

In this description, numerous specific details, such as component and system configurations, may be set forth in order to provide a more thorough understanding of the described embodiments. It will be appreciated, however, by one skilled in the art, that the described embodiments may be practiced without such specific details. Additionally, some well-known structures, elements, and other features have not been shown in detail, to avoid unnecessarily obscuring the described embodiments.

In the following description, references to "one embodiment," "an embodiment," "example embodiment," "various embodiments," etc., indicate that the embodiment(s) of the technology so described may include particular features, structures, or characteristics, but more than one embodiment may and not every embodiment necessarily does include the particular features, structures, or characteristics. Further, some embodiments may have some, all, or none of the features described for other embodiments.

As used in this description and the claims and unless otherwise specified, the use of the ordinal adjectives "first," "second," "third," etc. to describe an element merely indicate that a particular instance of an element or different instances of like elements are being referred to, and is not intended to imply that the elements so described must be in a particular sequence, either temporally, spatially, in ranking, or in any other manner.

FIG. 1 illustrates an example of an operating environment 100 that may be representative of some embodiments. As shown in FIG. 1, operating environment 100 may include an analysis system 105 operative to manage analytical data associated with analytical devices 115a-n. In some embodiments, analytical devices 115a-n may be or may include a chromatography system, a liquid chromatography (LC) system, a gas chromatography (GC) system, a mass analyzer system, a mass spectrometer (MS) system, an ion mobility spectrometer (IMS) system, a high-performance liquid chromatography (HPLC) system, a ultra-performance liquid chromatography (UPLC®) system, a ultra-high performance liquid chromatography (UHPLC) system, a solid-phase extraction system, a sample preparation system, a heater (for example, a column heater), a sample manager, a solvent manager, an in vitro device (IVD), combinations thereof, components thereof, variations thereof, and/or the like. Although LC, MS, and LC-MS are used in examples in this detailed description, embodiments are not so limited, as other analytical devices capable of operating according to some embodiments are contemplated herein. In various embodiments, one or more of analytical devices 115a-n may include a primary analytical device. In some embodiments, one or more of analytical devices 115a-n may include a client analytical device. In some embodiments, primary analytical device and a client analytical device may have the same or essentially the same hardware and/or software configuration. In various embodiments, the hardware and/or software configuration of a primary analytical device and a client analytical device may have sufficient similarity such that an analytical service developed on the primary analytical device may be adequately performed on the client analytical device.

In various embodiments, analysis system 105 may include computing device 110 communicatively coupled to analytical devices 115a-n. Computing device 110 may be operative to communicate with, control, monitor, manage, or otherwise process various operational functions of analytical devices 115a-n. In some embodiments, computing device 110 may be or may include a stand-alone computing device, such as a personal computer (PC), server, tablet computing device, cloud computing device, and/or the like. In some embodiments, computing device 110 may be a separate device from analytical devices 115a-n. In other embodiments, computing device 110 may be a part of, such as an integrated controller, analytical devices 115a-n.

As shown in FIG. 1, computing device 110 may include processing circuitry 120, a memory unit 130, and a transceiver 160. Processing circuitry 120 may be communicatively coupled to memory unit 130 and/or transceiver 160.

Processing circuitry 120 may include and/or may access various logic for performing processes according to some embodiments. For instance, processing circuitry 120 may include and/or may access analytical services logic 122, service generation logic 124, and/or service execution logic 126. Processing circuitry and/or analytical services logic 122, service generation logic 124, and/or service execution logic 126, or portions thereof, may be implemented in hardware, software, or a combination thereof. As used in this application, the terms "logic, "component," "layer," "system," "circuitry," "decoder," "encoder," and/or "module" are intended to refer to a computer-related entity, either hardware, a combination of hardware and software, software, or software in execution, examples of which are provided by the exemplary computing architecture 1000. For example, a logic, circuitry, or a layer may be and/or may include, but are not limited to, a process running on a processor, a processor, a hard disk drive, multiple storage drives (of optical and/or magnetic storage medium), an object, an executable, a thread of execution, a program, a computer, hardware circuitry, integrated circuits, application specific integrated circuits (ASIC), programmable logic devices (PLD), digital signal processors (DSP), field programmable gate array (FPGA), a system-on-a-chip (SoC), memory units, logic gates, registers, semiconductor device, chips, microchips, chip sets, software components, programs, applications, firmware, software modules, computer code, combinations of any of the foregoing, and/or the like.

Although analytical services logic 122 is depicted in FIG. 1 as being within processing circuitry 120, embodiments are not so limited. In addition, although service generation logic 124 and service execution logic 126 are depicted as being a logic of analytical services logic 122, embodiments are not so limited, as service generation logic 124 and service execution logic 126 may be separate logics and/or may not be standalone logics but, rather, a part of analytical services logic 122. For example, analytical services logic 122, service generation logic 124, service execution logic 126, and/or any component thereof, may be located within an accelerator, a processor core, an interface, an individual processor die, implemented entirely as a software application (for instance, analytical services application 136) and/or the like.

Memory unit 130 may include various types of computer-readable storage media and/or systems in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory, solid state drives (SSD) and any other type of storage media suitable for storing information. In addition, memory unit 130 may include various types of computer-readable storage media in the form of one or more lower speed memory units, including an internal (or external) hard disk drive (HDD), a magnetic floppy disk drive (FDD), and an optical disk drive to read from or write to a removable optical disk (e.g., a CD-ROM or DVD), a solid state drive (SSD), and/or the like.

Memory unit 130 may store an analytical services application 136 that may operate, alone or in combination with analytical services logic 122, to perform various analytical functions according to some embodiments. In various embodiments, analytical services application 136 may interact with analytical devices 115a-n and/or components thereof through various drivers 132 (which may include application programming interfaces (APIs) and/or the like).

In various embodiments, analytical services application 136 operate to access, generate, export, modify, provide, and/or the like analytical services packages 142. In various embodiments, application services application 136 may provide an interface to include and/or modify scripts, code, or other structures associated with an analytical services package 142. In this manner, analytical services packages 142 may be or may include scripted components, or may include analytical device information indicative of the performance or features of analytical device 115a-n. Such analytical device information may include, without limitation, spectra information, retention time information, performance characteristics, collision cross section (CCS) information, drift time information, chromatogram information, instrument precision, resolution, sensitivity, or accuracy information, mass range, acquisition rate, dynamic range, error tolerance information, solvent capacity, maximum operating pressure, sample capacity, and/or the like.

In some embodiments, analytical services application 136 may operate to generate analytical services for one or more of analytical devices. For instance, analytical device 115a may be or may include a primary analytical device, instrument, system, and/or the like, such as a primary LC-MS system. An analysis service or process, such as a service for analyzing compounds of a certain class (a "sample analysis"), may be performed using the LC-MS system. Performance of a service may generate process information 134 and/or analytical data 138. Process information 134 may include information required to perform a service using the LC-MS system. Non-limiting examples of process information 134 may include process steps, process step sequences, settings, parameters, and/or the like. Analytical data 138 may include data associated with analysis results of performing a service using the LC-MS system. Non-limiting examples of analytical data 138 may include spectra information, retention time information, collision cross section (CCS) information, drift time information, chromatogram information, and/or the like.

An analytical service may be performed using a primary analytical device 115a-n until it has been accepted. For instance, in some embodiments, an analytical services package may include or be associated with an acceptance flag or variable to indicate whether the analytical services package and/or related analytical service has been accepted. For example, performance of the sample analysis using LC-MS may be performed repeatedly, for example, being refined, modified, and/or the like until acceptable. In some embodiments, acceptance may be based on an acceptance factor including, without limitation, acceptance by an operator, acceptance based on a regulatory process (for instance, FDA), and/or the like. In some embodiments, an analytical services package 142 may include or may be associated with one or more regulatory certificates, such as including the regulatory certificate or data structure indicating associated regulatory certificates in the analytical services packet (for example, such that an unmodified method of the analytical services package complies with the associated regulatory certificates). In some embodiments, qualification information 140 may be used for the qualification or acceptance of an analytical service. For example, qualification information 140 may include, without limitation, thresholds, calibration requirements, blank requirements, reagent requirements, tolerances, error information, and/or the like that may be used to qualify an analytical service. For example, an analytical process may be accepted (or partially accepted) if the analytical data for a certain number of runs of the analytical process meets the qualification information 140. Embodiments are not limited in this context.

In various embodiments, the analytical services application 136 (alone or in combination with service generation logic 124) may generate an analytical services package 142 for an analytical service. For example, if the sample analysis being performed on the primary LC-MS device is acceptable, analytical services application 136 may generate sample analysis package for the sample analysis service. The analytical services package 142 may provide information for the analytical service to be performed on a client analytical device 115*a-n*. For example, analytical device 115*n* may be a client LC-MS device. Computing device 110 may provide an interface for operating the client LC-MS device.

In some embodiments, an analytical services package 142 may include an analytical method (for example, proteomic sample analysis method) and information associated with performing the method, such as security information (for instance, user security level required to run the method), validation requirements (for example, the method is intended for FDA validated LC-MS devices), method status (for example, for internal use only, non-FDA approved, in development, for research purposes, approved for clinical research, approved for IVD, and/or the like), analytical device information, and/or the like.

In some embodiments, although only one computing device 110 is depicted in FIG. 1, there may be separate computing devices for operating a primary analytical device (for instance, a primary computing device) and client analytical devices (for instance, a client computing device), which may be at separate locations. In various embodiments, a primary computing device and a client computing device may include and/or operate different versions of analytical services logic and/or analytical services application. For example, a client computing device 110 may include service execution logic 126, but not service generation logic 124. In another example, a client computing device may not run a full version of analytical services application that is able to modify analytical services and/or analytical services packages (beyond authorized modifications). Embodiments are not limited in this context.

In various embodiments, a client computing device 110 may receive an analytical service package 142. For example, a client computing device for a client LC-MS system may access a sample analysis package. In some embodiments, analytical services packages may be stored in a data source 154*a-n* accessible via network 150. Analytical services application 136 (for example, with service execution logic 126) may execute the analytical service of the analytical services package. For example, the sample analysis package may include information, instructions, and/or the like to provide for performance of the sample analysis on the client LC-MS system. In some embodiments, analytical services application 136 may generate various reports 144 responsive to performance of an analytical service by analytical device 115*a-n*.

Accordingly, in some embodiments, analytical services application 136 may provide a user interface to a client analytical device 115*a-n*, such as an LC-MS IVD medical device, to allow users to execute (or "play-only"), process data, and report results, for example, as part of a validation exercise, a routine laboratory service, and/or the like. In some embodiments, a client analytical services application 136 may allow a user to start up and shutdown a client analytical device 115*a-n*, select analytical services packages to perform associated methods, determine client analytical device 115*a-n* status and/or readiness to identify, correct and resolve any system errors before diagnostic tests are performed, define a set of samples for analysis (a batch of samples), execute or "play" methods for the analysis of a sample set to acquire analytical data, process raw data collected by the client analytical device 115*a-n*, review processed data to ensure laboratory-defined quality metrics for analytical data are satisfied, and/or generate report(s) for dissemination to test requestor(s), archive purposes, and/or other stakeholders.

In addition, as described in more detail herein, according to some embodiments, a client analytical device 115*a-n* may provide a process to define access privileges on a per user basis to ensure that users are only permitted to perform functions (and/or tests) for which they are qualified. An administrator level, for example, may define the functions and parameters to which subsequent users are allowed to view, edit, delete, access, and/or the like. Some embodiments may provide a process to identify analytical services that have been developed and are suitable for use in client environment, and prevent access to analytical services that are not (for instance, analytical services designed for a different hardware configuration). In various embodiments, client analytical services application 136 may be configured to log system errors as well as monitor and record experimental conditions during the acquisition of analytical data 138, indicate that the performance of the client analytical system is adequate to perform a specific test (for example, via a system suitability test and/or the like). Embodiments are not limited in this context.

In addition, analytical services application 136 may be configured to compare analytical device information within an analytical services package 142 to information indicative of or otherwise associated with an analytical device 115*a-n* communicatively coupled with or otherwise executing analytical services application 136. The analytical services application 136 may be configured to present data to the user indicative of the suitability of the selected analytical services package 142 to be performed with the coupled analytical device 115*a-n* (for example, any errors, incompatibilities, warnings, data outside of tolerance, failures, and/or the like).

Additionally or alternatively, the analytical services application 136 may be configured to convert analytical data 138 and/or process information 134 received during or after execution of analytical services application 136 based on differences between analytical device information embedded within analytical services package 142 and analytical device information for analytical device 115*a-n* in communication with analytical services application 136.

Additionally or alternatively, the analytical services package may contain data indicative of the performance of the original (or primary) analytical device 115*a-n* used to create the analytical services package when a reference or standard analyte is analyzed by the analytical services application. Data indicative of the performance of a new or different analytical device 115*a-n* may be acquired through analyzing the same reference or standard analyte. The difference between data indicative of the performance of the original analytical device and the new or different analytical device may be retained as a conversion filter. In some embodiments, a conversion filter may be applied to convert analytical data 138 and/or process information 134 received during or after execution of analytical services application 136 on such new or different analytical device to ensure consistency of results on different analytical devices. For example, differences in the acquired spectra for a reference standard on a LC-MS device used to create the analytical services package and the spectra for that same reference standard acquired on a new or different LC-MS device may be applied to all results acquired on that new or different LC-MS device. In some embodiments, a conversion filter may include and/or may access a library, database, or other data store of conversion information that may be used to translate performance of a process associated with an analytical services package 142 from a first machine (for instance, an originating machine used to generate the analytical services package) to a second machine (for instance, a different machine being used to execute an analytical services package).

In some embodiments, analytical services application 136 may operate to translate a process associated with an analytical services package 142 to different types of analytical devices. For example, a first analytical device may require different reagents, reagent volumes, reagent sequences, parameters, parameter values, calibrations, sample processing time, sample volumes, and/or the like. Analytical services application 136 may operate to determine the different requirements to translate a process of an analytical services package, for example, via device information, translation tables, and/or the like. In some embodiments, the different requirements to translate the process may be determined during execution of the process on the analytical device. For instance, analytical services application 136 may determine that different parameter values are required by a certain type, manufacturer, and/or the like of analytical device to have a successful analysis run.

Figure 2:
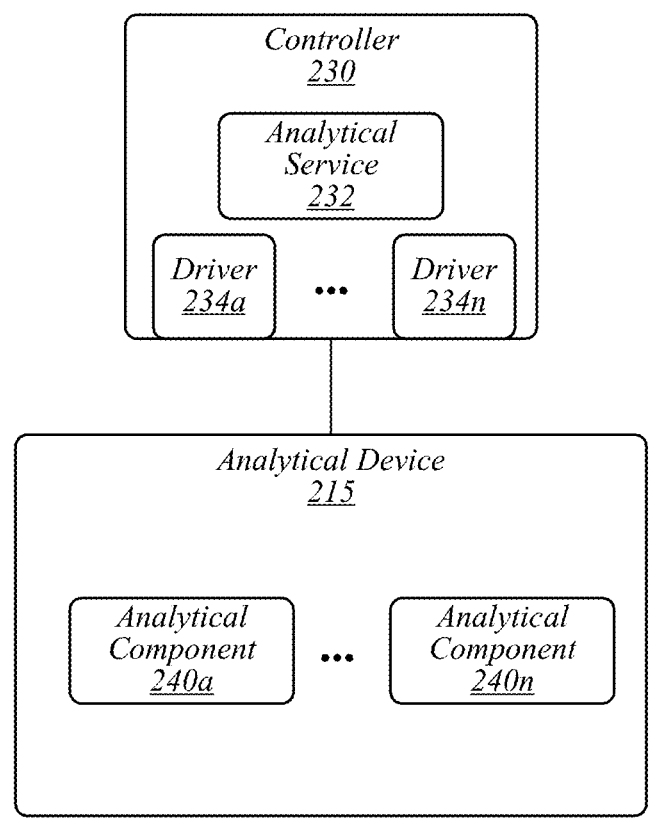
FIG. 2 illustrates an embodiment of a second operating environment.

FIG. 2 illustrates an example of an operating environment 200 that may be representative of some embodiments. As shown in FIG. 2, operating environment 200 may include a controller 230 operative to execute an analytical service 232 on analytical device 215. Controller 230 may include various processors, logic, and/or the like. In some embodiments, controller 230 may be part of a computing device (for instance, computing device 110). In various embodiments, controller 230 may be a part of analytical device 215, such as an embedded controller or computing system. Embodiments are not limited in this context. In some embodiments, controller 230 may be or may include a data acquisition controller.

Analytical device 215 may include a plurality of analytical components 240a-n. For example, analytical device 215 may include an LC-MS device and analytical component 240a may include an LC component and 240n may include an MS component. In another example, analytical device 215 may include an MS device, and component 240a may include a sample introduction device and component 240n may include a detector. Embodiments are not limited in this context.

In various embodiments, controller 230 may receive a request (for instance, from a batch submitter, results reviewer, and/or the like) to run a batch of samples. Controller 230 may execute analytical service 232 on analytical device 215, for example, using drivers 234a-n to control operational aspects of analytical components 240a-n. Analytical service 232 may be from an analytical services package generated by a method developer using a primary analytical device 215. Controller 230 may execute or "play" the method specified in analytical service 232. The results of execution of analytical services 232 on analytical device 215 may be provided to a data consumer, such as a LIMS.

Figure 3:
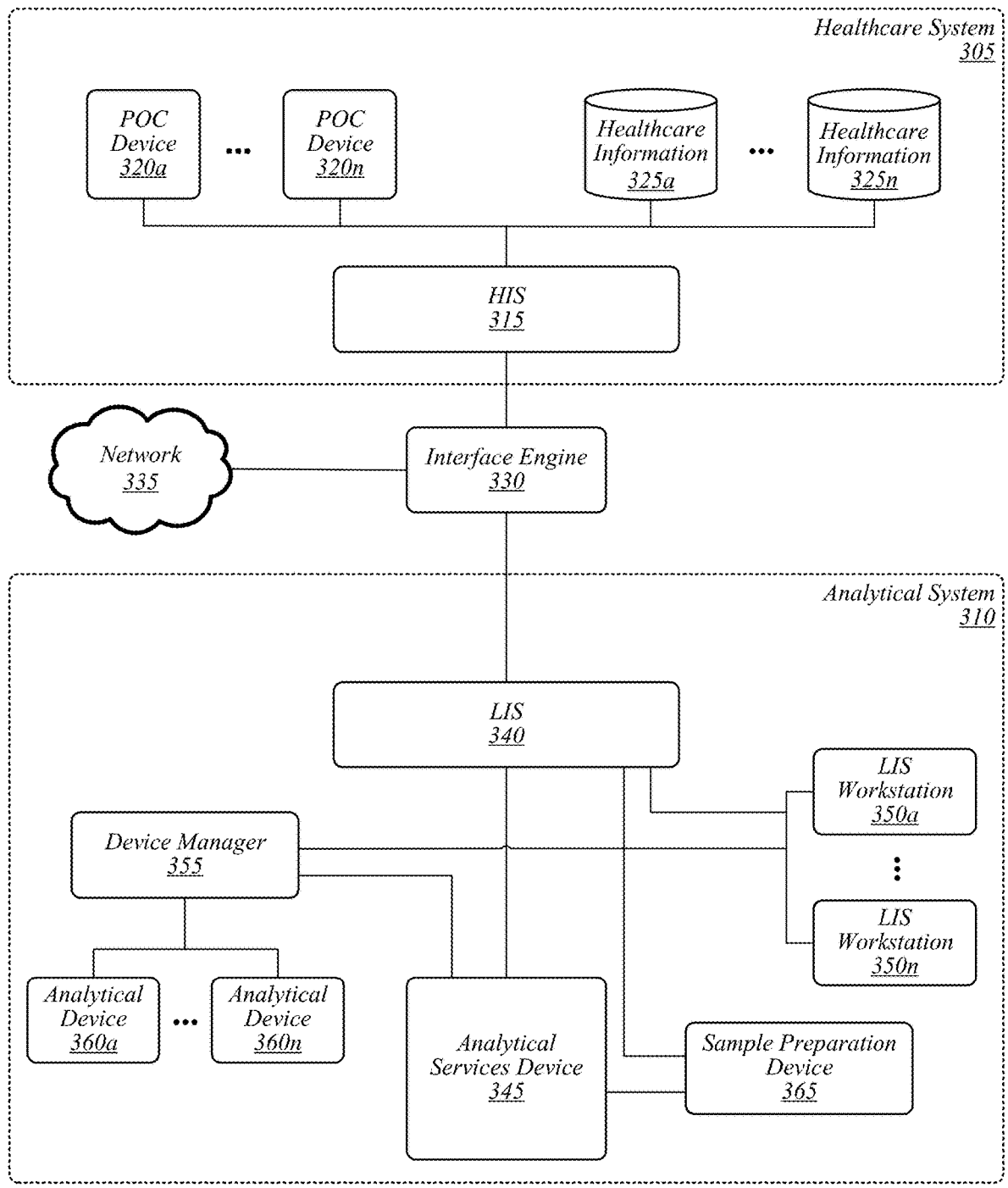
FIG. 3 illustrates an embodiment of a third operating environment.

FIG. 3 illustrates an example of an operating environment 300 that may be representative of some embodiments. As shown in FIG. 3, operating environment 300 may include a healthcare system 305 operably coupled to an analytical system 310 via an interface engine 310 through a network 335. Healthcare system 305 may include a plurality of point-of-care devices 320a-n and/or healthcare information sources 325a-n operably coupled to a hospital information system (HIS) 315. In various embodiments, HIS 315 may be operably coupled to a LIS of analytical system 310 via interface engine 330. A device manager 355 may operate to manage, interface, support, or otherwise control various operational aspects of a plurality of analytical devices 360a-n. In some embodiments, at least a portion of analytical devices 360a-n may be client analytical devices. In various embodiments, at least a portion of analytical devices 360a-n may be primary analytical devices.

An analytical services device 345 may include a computing device operative to generate analytical services packages with primary analytical devices 360a-n and/or to provide analytical services packages to client analytical devices 360a-n. In some embodiments, analytical system 310 may include a plurality of LIS workstations 350a-n operative to monitor primary analytical devices 360a-n. In various embodiments, LIS workstations 350a-n may execute a version of an analytical services application to view, generate, modify, load, and/or the like analytical services packages to/from analytical services device 345. In exemplary embodiments, analytical system 310 may include a sample preparation device 365 that may provide samples to analytical devices 360a-n during generation and/or execution of an analytical service.

Figure 4:
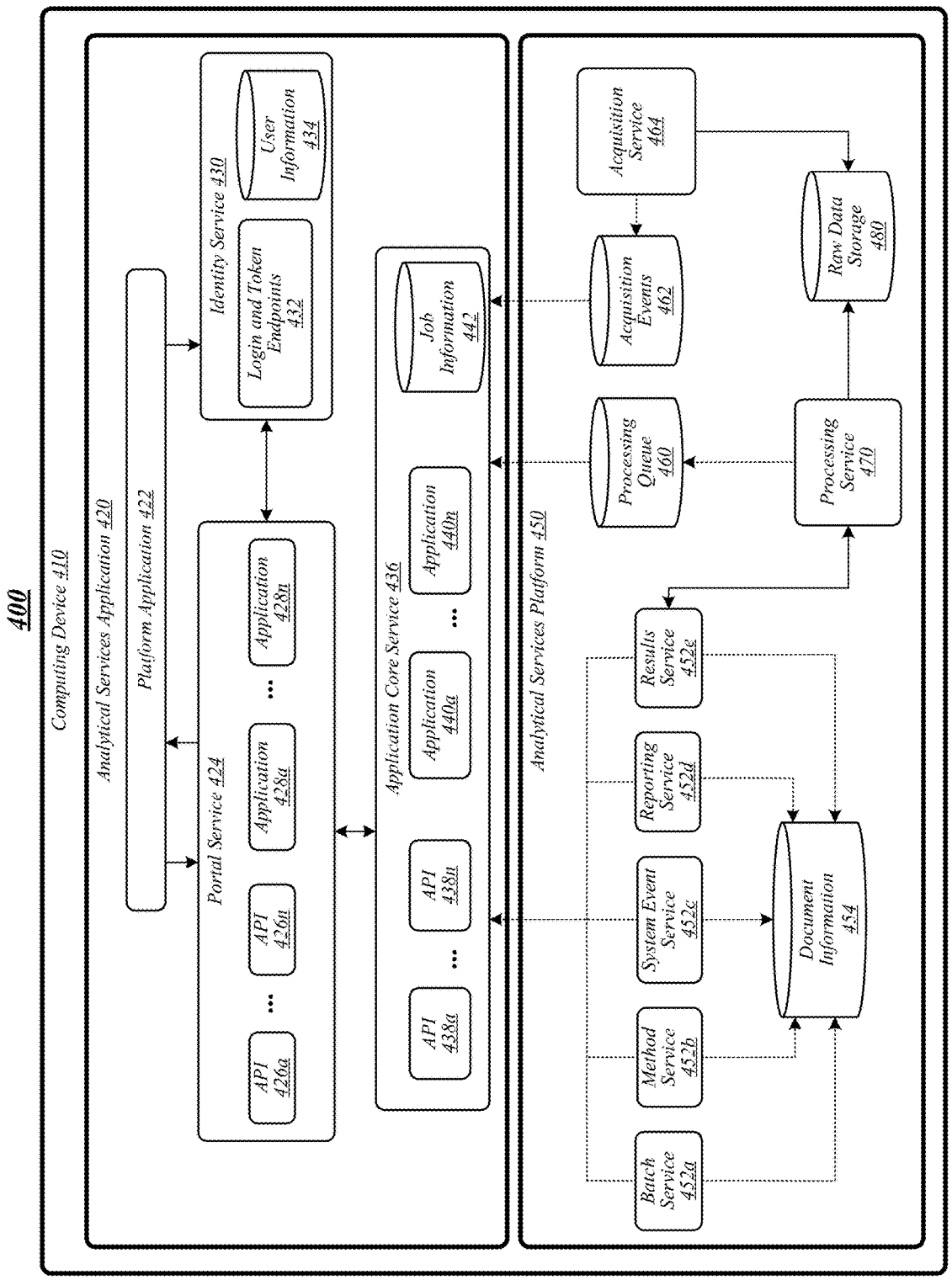
FIG. 4 illustrates an embodiment of a fourth operating environment.

FIG. 4 illustrates an example of an operating environment 400 that may be representative of some embodiments. As shown in FIG. 4, operating environment 400 may include a computing device 410 executing, hosting, or otherwise implementing an analytical services application 420 and an analytical services platform 430. In some embodiments, analytical services application 420 may include a platform application in communication with a portal service 424 and an identity service 430. Portal service 424 may include various APIs 426a-n and applications 428a-n. Portal service 424 may be in communication with an application core service 436 having APIs 438a-n, applications 440a-n, and job information 442.

Analytical services platform 450 may include various services including, without limitation, a batch service 452a, a method service 452b, a system event service 452c, a reporting service 452d, and a results service 452e, providing information to document information 454. A processing service 470 may be in communication with a processing queue 460 and raw data storage 480. An acquisition service 464 may receiving events from an acquisition events 462 data store in communication with application core service 436.

Included herein are one or more logic flows representative of exemplary methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, hardware, or any combination thereof. In software and firmware embodiments, a logic flow may be implemented by computer executable instructions stored on a non-transitory computer readable medium or machine readable medium, such as an optical, magnetic or semiconductor storage. The embodiments are not limited in this context.

Figure 5:
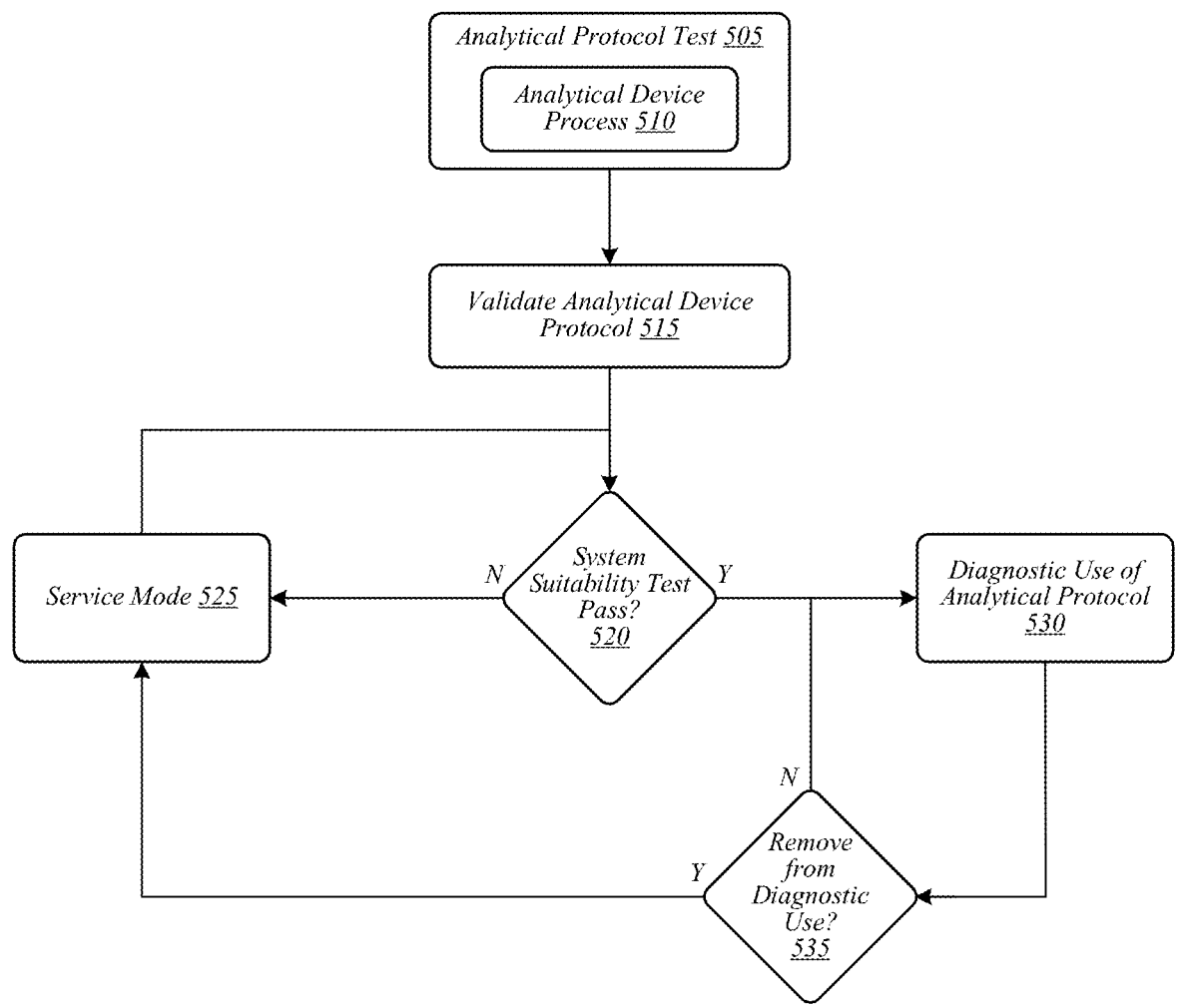
FIG. 5 illustrates a first logic flow according to some embodiments.

FIG. 5 illustrates an embodiment of a logic flow 500. The logic flow 500 may be representative of some or all of the operations executed by one or more embodiments described herein, such as analysis system 105 and/or computing device 410. In some embodiments, logic flow 500 may be representative of some or all of the operations of determining a device status, for example, of a client analytical device.

As shown in FIG. 5, a candidate analytical device protocol test 505 may include a candidate device method 510. For example, a candidate LC-MS protocol test may include a candidate method (or service) that may be run on a particular LC-MS device. At block 515, the analytical device protocol may be validated by logic flow 500. At block 520, logic flow 500 may determine whether the analytical device has passed a system suitability test. For example, when in service, an analytical device may be assessed for suitability to perform a diagnostic test, such as the validated analytical device protocol. The system suitability test may be based on various factors, such as passage of quality control tests, validation according to a regulatory protocol, and/or the like. If the analytical device passes the system suitability test, diagnostic use of the analytical protocol may proceed using the analytical device at block 530. If the analytical device does not pass the system suitability test or the analytical device has otherwise been designated as being removed from diagnostic use, logic flow 500 may cause the analytical device to enter a service mode 525 or otherwise be unavailable for performing the analytical protocol. In some embodiments, if an analytical device is removed from diagnostic use for any test, the device must be shown to pass system suitability for that test before being used for any further testing. In various embodiments, device status may also change when the device is being used for development of new LDTs, undergoing maintenance, or out of service for any other reason.

Figure 6:
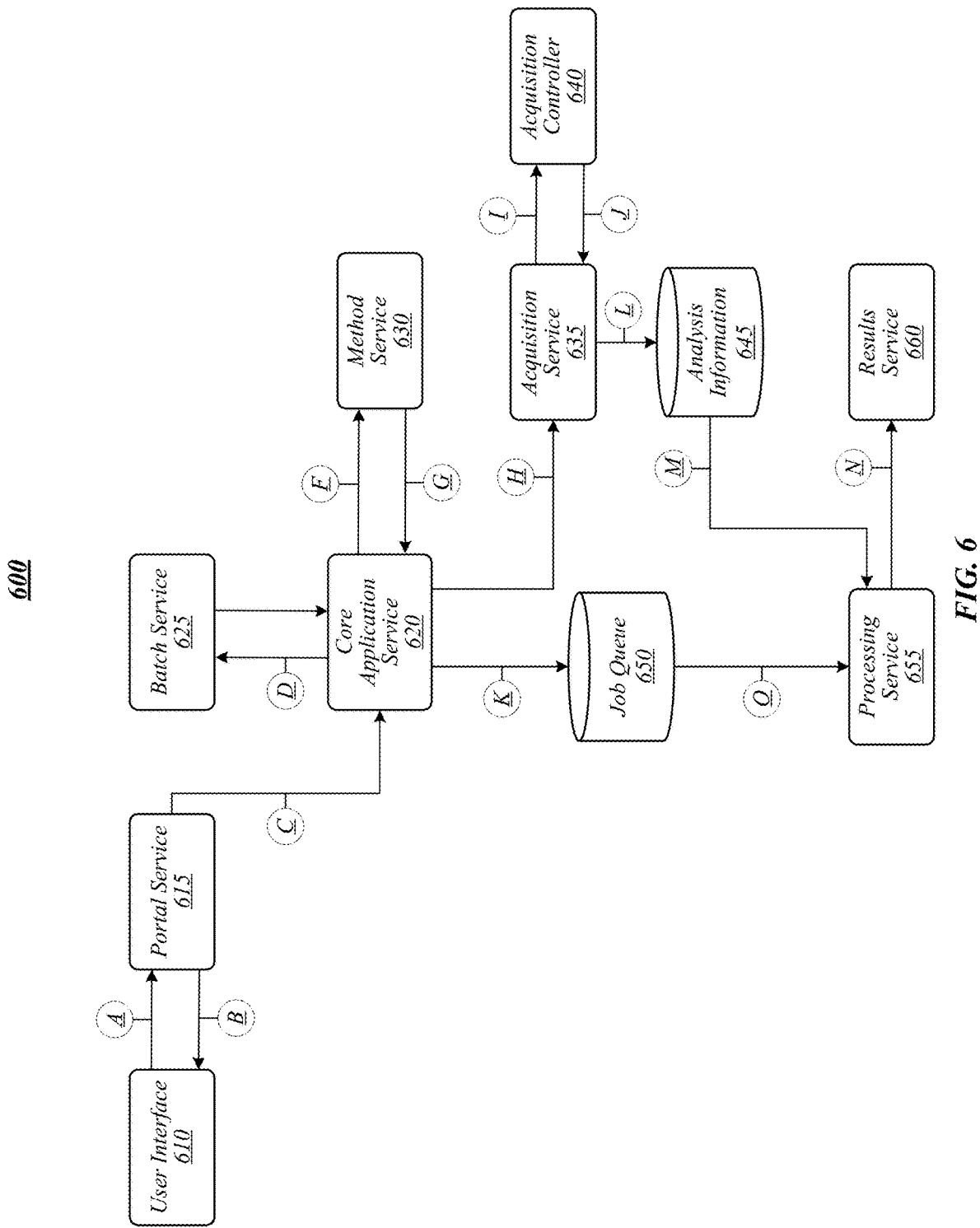
FIG. 6 illustrates a second logic flow according to some embodiments.

FIG. 6 illustrates an embodiment of a logic flow 600. The logic flow 600 may be representative of some or all of the operations executed by one or more embodiments described herein, such as analysis system 105 and/or computing device 410. In some embodiments, logic flow 600 may be representative of some or all of the operations during acquisition and processing of a batch for an LC-MS system.

For example, when batches are submitted for acquisition, job entities may be created consisting of (at least) the selected method and batch. A core application service of the analytical services application may submit the batch to be converted into injection task sequence. In some embodiments, injection data may be posted back and stored on disk. Acquisition events may be used by the core application service to coordinate processing operations and submit processing jobs to a processing service, for example, via a shared queue. The processing service may read injection data, generate results and store results via a result service of the analytical services application. In various embodiments, processing service may post status notifications to a requesting service.

As shown in FIG. 6, at block 610, logic flow may receive input A from a user interface at a portal service at block 615. For example, input A may include batch information, method identifier, and/or the like. In some embodiments, portal service may provide information B for display at the user interface. At block 620, a core application service of the analytical services application may receive input C from the portal service. In various embodiments, input C may be or may include the information from input A (for instance, batch information, method identifier, and/or the like). At block 620, core application service may provide the batch id D to the batch service and may receive a batch E matching the batch id D from the batch service. Logic flow may provide a method id F to method service at block 630, and the method service may provide a method G.

At block 635, logic flow 600 may receive an acquisition method batch H at the acquisition service from core application service. At block 640, logic flow 600 may provide injection data J from an acquisition controller in response to an acquisition method task list I. At block 645, logic flow 600 may receive injection data L at an analysis information component (for instance, a samples store). At block 650, logic flow 600 may receive a processing job (for example, processing method, injection data id(s), and/or the like) at a job queue. At block 655, logic flow 600 may receive a processing job O from the job queue at the processing service and injection data M from the analysis information component. The job may be processed, for instance, by a client analytical device. At block 660, logic flow 600 may receive a results set N at a results service.

Figure 7:
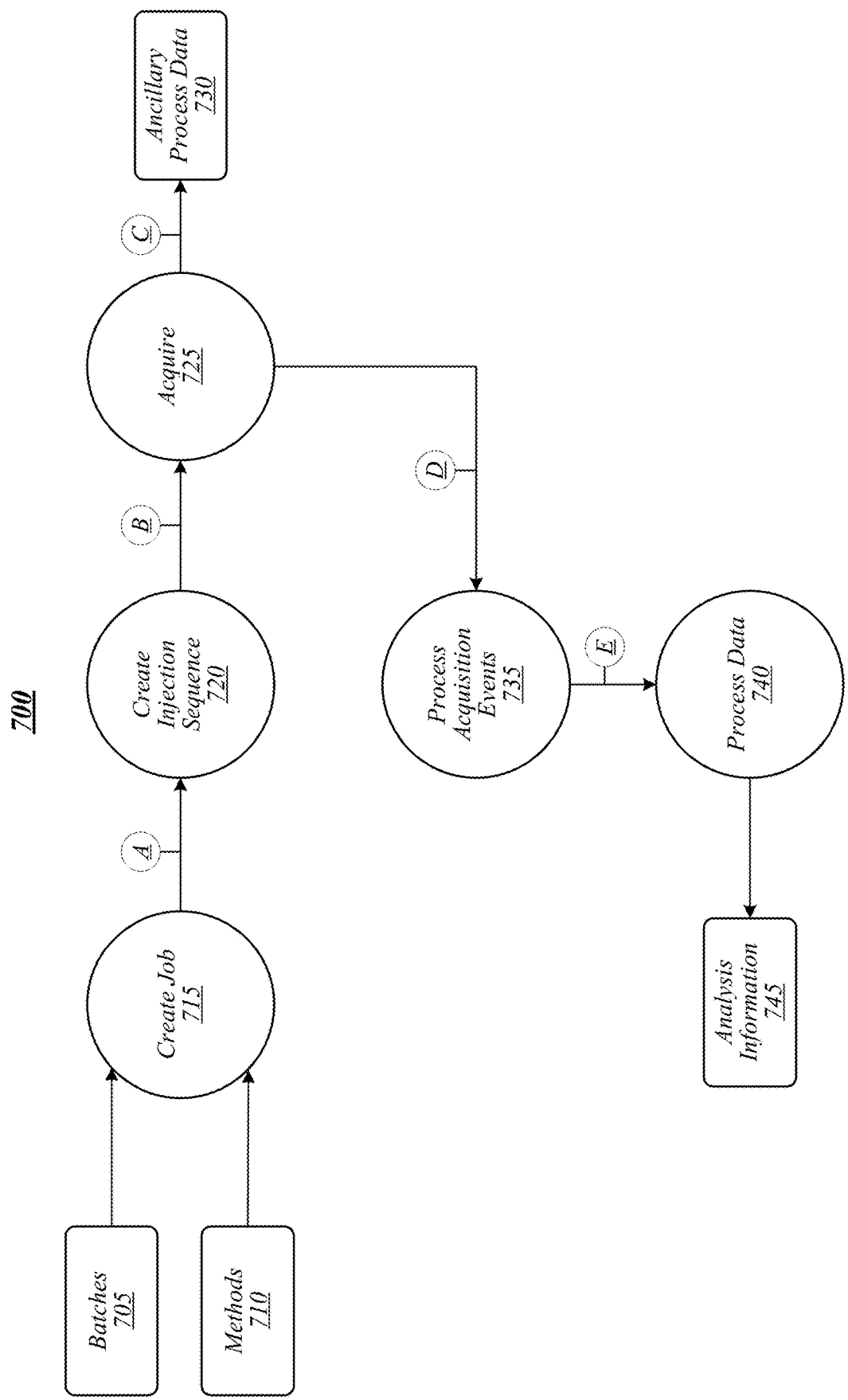
FIG. 7 illustrates a third logic flow according to some embodiments.

FIG. 7 illustrates an embodiment of a logic flow 700. The logic flow 700 may be representative of some or all of the operations executed by one or more embodiments described herein, such as analysis system 105 and/or computing device 410. In some embodiments, FIG. 7 may represent a data flow associated with the information flow during acquisition and processing of batches for an LC-MS system.

Batches 705 and methods 710 may be provided to create a job at block 715. Logic flow 700 may provide a job A to create an injection sequence at block 720. An injection sequence B may be provided to an acquisition service at block 725. The acquisition service may provide injection data C to an ancillary process data component (for instance, injection data) at block 730. An acquisition event D may be provided to a process acquisition events service at block 735. Process information E (for instance, channel ID, processing settings, and/or the like) may be provide to a process data service at block 740. An analytical device may perform the process to generate analysis information at block 745.

Figure 8A:
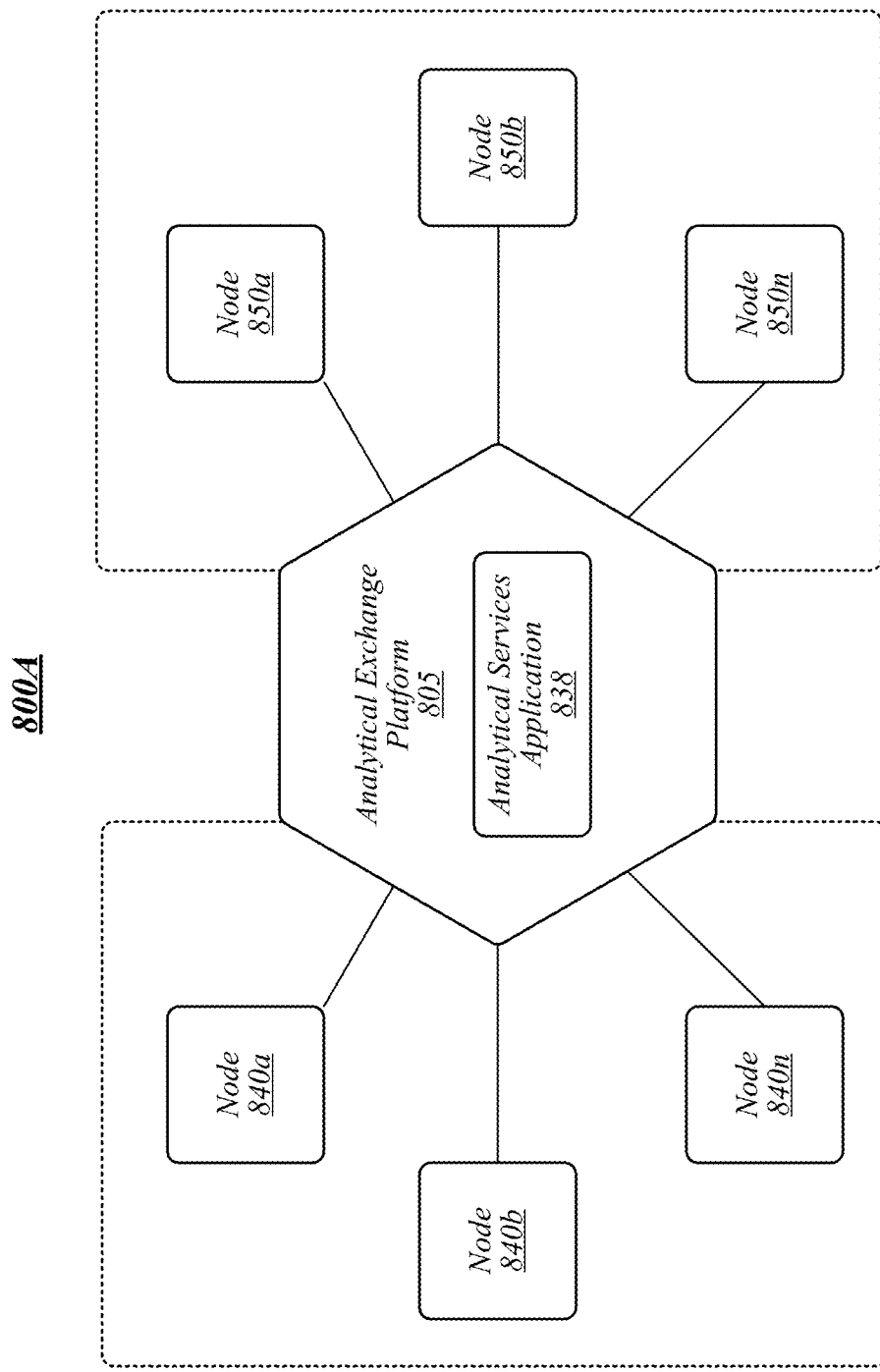
FIG. 8A illustrates an embodiment of a fifth operating environment.

FIG. 8A illustrates an example of an operating environment 800A that may be representative of some embodiments. As shown in FIG. 8A, operating environment 800A may include an analytical exchange platform (or an analytical device platform) 805 associated with an analytical service application 838. In some embodiments, analytical exchange platform 805 may be operative to provide for the exchange of analytical information among interested entities. In various embodiments, analytical exchange platform 805 may include an application platform operative to provide data exchange services among nodes 840a-n and 850a-n. In exemplary embodiments, analytical exchange platform 805 may be a software platform, suite, set of protocols, and/or the like provided to customers by a manufacturer, product source, and/or developer ("developer") associated with an analytical instrument. A non-limiting example of a developer may be the Waters Corporation of Milford, Massachusetts, United States of America. For example, a developer may provide analytical exchange platform 805 as a data exchange interface for an LC, MS, LC-MS, and/or the like analytical instrument provided to an entity by the developer. An entity, such as a pharmaceutical manufacturer, research organization, product supplier, food supply chain entity, environmental testing entity, and/or the like using analytical instrument provided by developer may use analytical exchange platform 805 to implement analytical service application 838 according to some embodiments. Other entities may access analytical exchange platform 805 via a GUI, such as a client application, web interface, mobile app, and/or the like, to perform functions associated with analytical service application 838. In some embodiments, at least a portion of analytical exchange platform 805 may be hosted in a cloud computing environment.

For example, in some embodiments, a developer or another entity may develop analysis services packages, methods, tests, validation protocols and/or the like. The developer may provide the analysis service packages to client analytical devices via analytical exchange platform. Nodes 840*a-n* may be data producers for analytical service application 838 and nodes 850*a-n* may be data consumers of analytical service application 838. An entity may be both a data producer and a data consumer. For example, node 840*a* may be a clinic operating a client LC-MS IVD device. Node 850*a* may be a regulatory body (for instance, the FDA) operative to generate analytical service packages for validating LC-MS IVD devices and node 850*b* may be a device manufacturer operating to generate test methods for analyzing samples in a clinical setting using the LC-MS IVD device. In some embodiments, analytical exchange platform 805 may operate according to a cloud-based model and/or an "as-a-Service" model. In this manner, analytical exchange platform 805 may provide for a service that provides a single, central platform that would allow entities to access analytical services packages.

In some embodiments, analytical results and/or portions thereof (for example, any errors, data outside of tolerance, failures, and/or the like) may be provided to an analytical services package developer from a user. In this manner, a developer may become aware of the status of an analytical services package and make corrections, pass/fail the analytical services package, and/or the like.

Figure 8B:
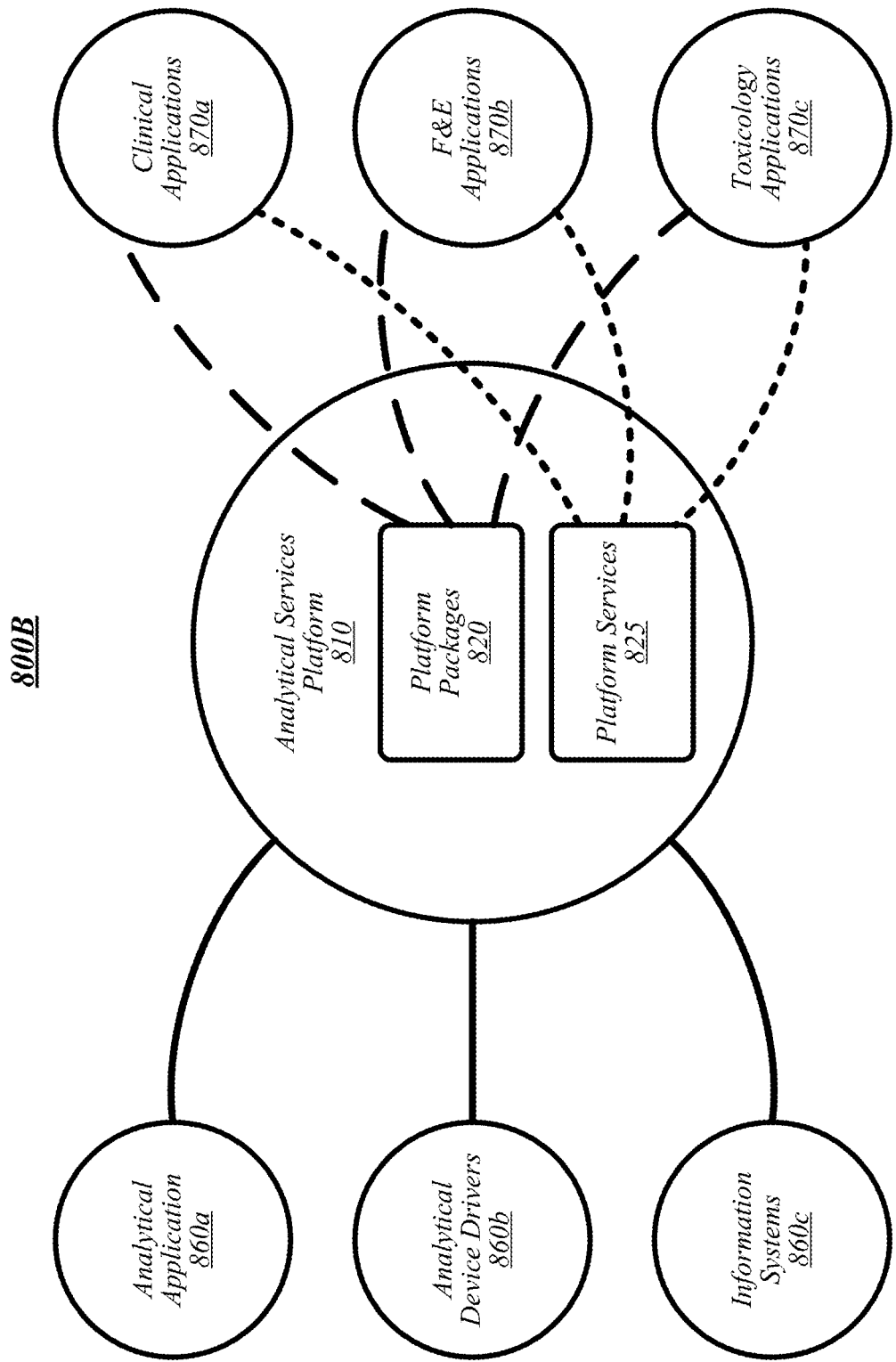
FIG. 8B illustrates an embodiment of a sixth operating environment.

FIG. 8B illustrates an example of an operating environment 800B that may be representative of some embodiments. As shown in FIG. 8B, operating environment 800B may include a particular implementation of an analytical services platform 810 that may include platform packages 820 and platform services 825. Non-limiting examples of platform packages 820 may include user interface (for instance, web services, client application user interfaces, and/or the like), data models, analytical task management, and/or the like. Non-limiting examples of platform services may include batch services, results services, method services, acquisition services, processing services, and/or the like.

Analytical services platform 810 may include and/or may be in communication with various service providers, such as analytical application 860*a*, analytical device drivers 860*b*, and/or information systems 860*c*. An analytical application 860*a* may include a method development application with clinical input. Analytical device drivers 860*b* may include drivers for various components of an analytical device (for instance, an LC driver and an MS driver for an LC-MS system). Information systems 860*c* may include various databases, including third-party databases such as LIS, LIMS, HIS, and/or the like. Embodiments are not limited in this context. Analytical services platform 810 may provide various applications, such as a clinical application 870*a*, an F&E application 870*b*, a toxicology application 870*c*, and/or the like. In this manner, a suite of common platform packages 820 and platform services 825 may be configured to provide services in a wide array of applications.

Figure 9A:
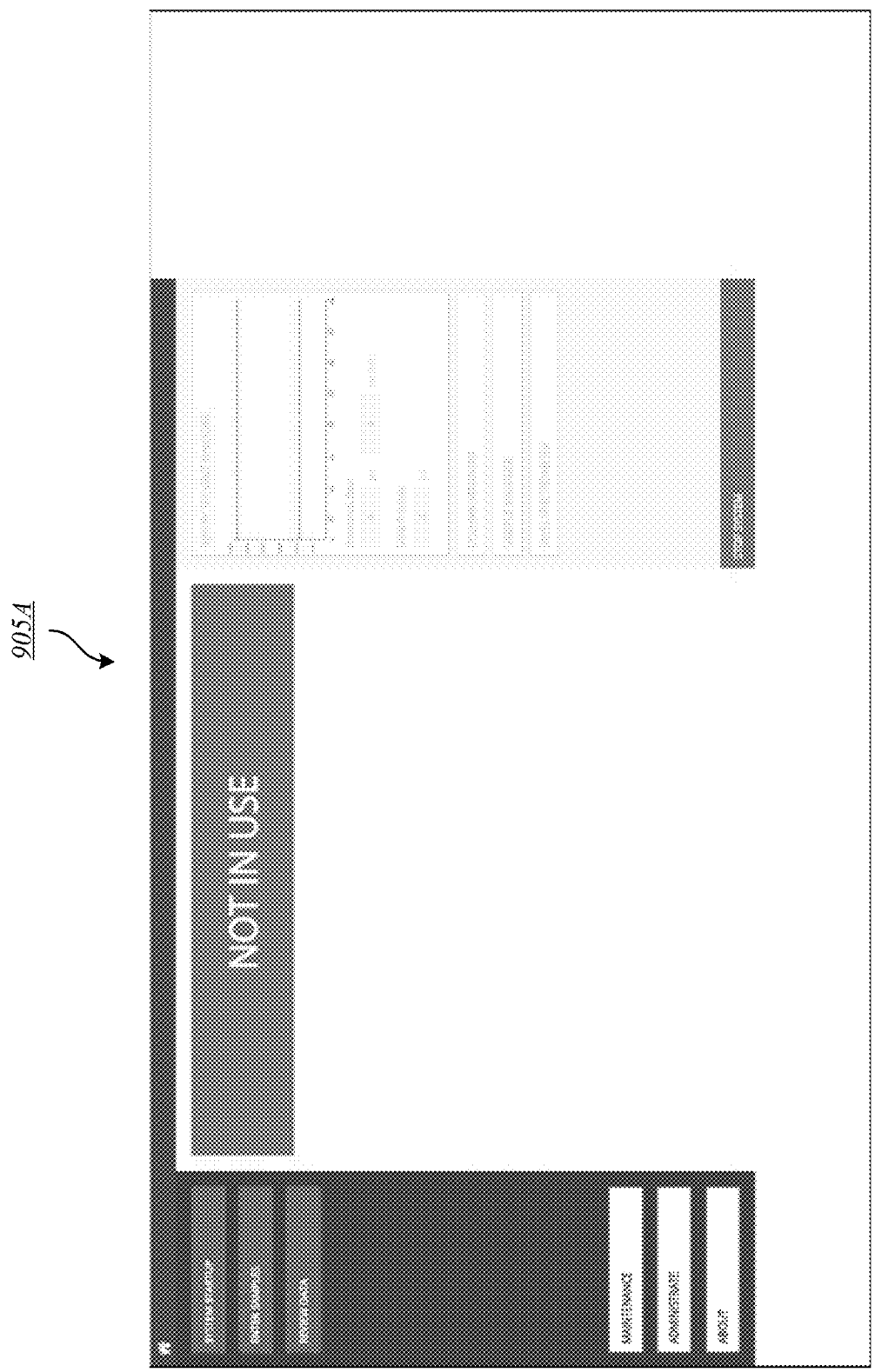
FIGS. 9A-9S depict illustrative screen images from an analytical services application according to some embodiments.
Figure 9B:
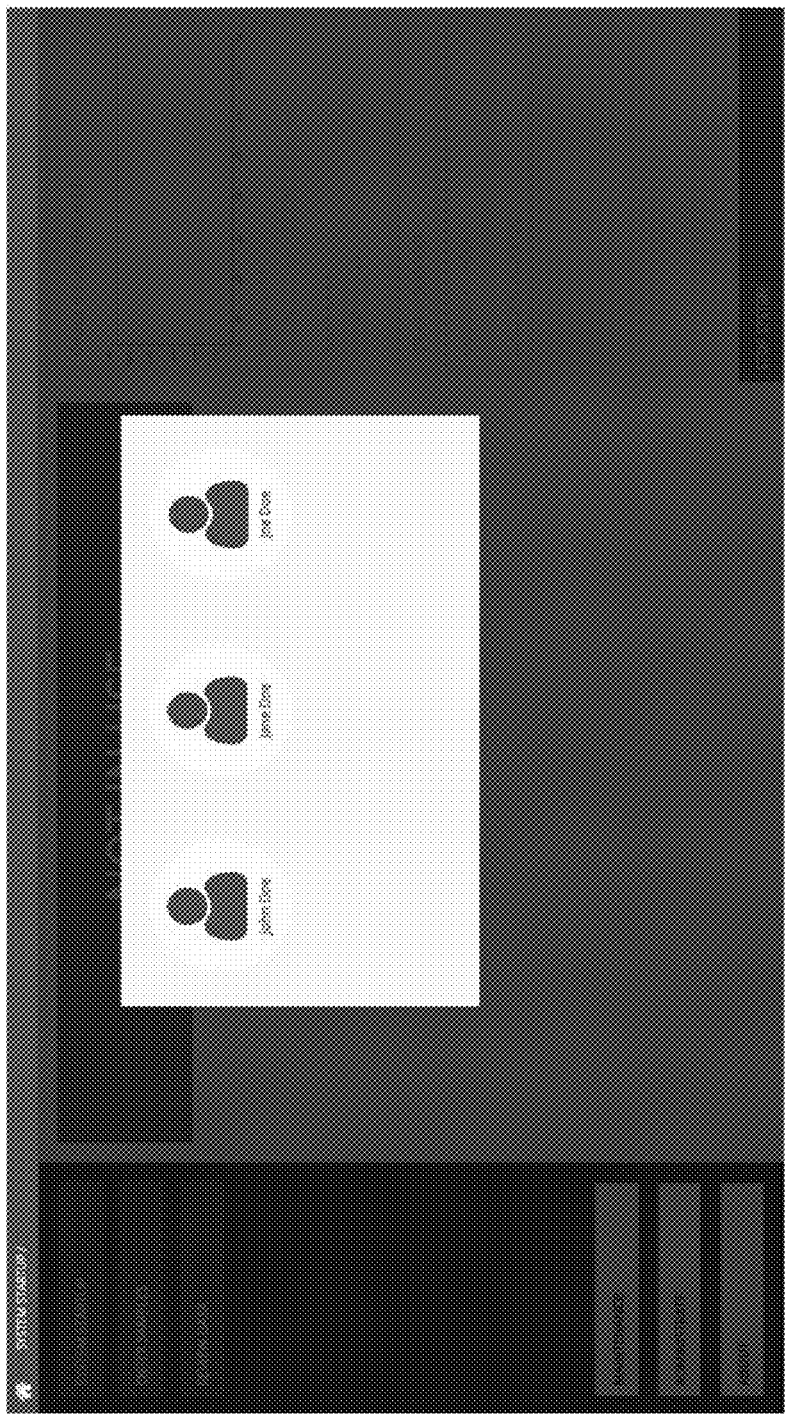

FIGS. 9A-9S depict illustrative screen images from an analytical services application according to some embodiments. In various embodiments, the analytical services application may be for an LC-MS system. FIG. 9A depicts an illustrative start up screen 905A showing that the LC-MS system is not in use. Selection of "System Startup" may cause screen 905B of FIG. 9B to be displayed. Screen 905B may be or may include a user selection screen. In some embodiments, certain actions within analytical services application may require user login or verification. In various embodiments, the user performing an action may be recorded in a log, time stamp, database, and/or the like. In some embodiments, each user may belong to a security level, role, group, and/or the like. For example, an analyst role may be allowed to collect and prepare specimens to make LC-MS samples for analysis on the device, perform testing using the device, performs basic troubleshooting and routine maintenance upon the device, and/or the like. A super analyst role may be allowed to perform all analyst permissions and produce LDTs for use on the device, perform more specialized device set-up such as hardware configuration, advanced troubleshooting and advanced user maintenance upon the device, review and approve data subject to qualifications/training, and as delegated by supervisor, and/or the like. A supervisor role may be allowed to supervise the use and performance of the device and review/approve data for reporting as delegated by laboratory director, coordinate communications with third parties for service, installation etc., and/or the like. Other roles may include operator, laboratory director, third-party integrator, vendor service representative, and/or the like. Embodiments are not limited in this context. In some embodiments, an analytical services package may include specified roles for one or more aspects of the analytical service. For example, the analytical services package may specify roles that may view the analytical service, run the analytical service, sign off on analytical results, and/or the like.

Figure 9C:
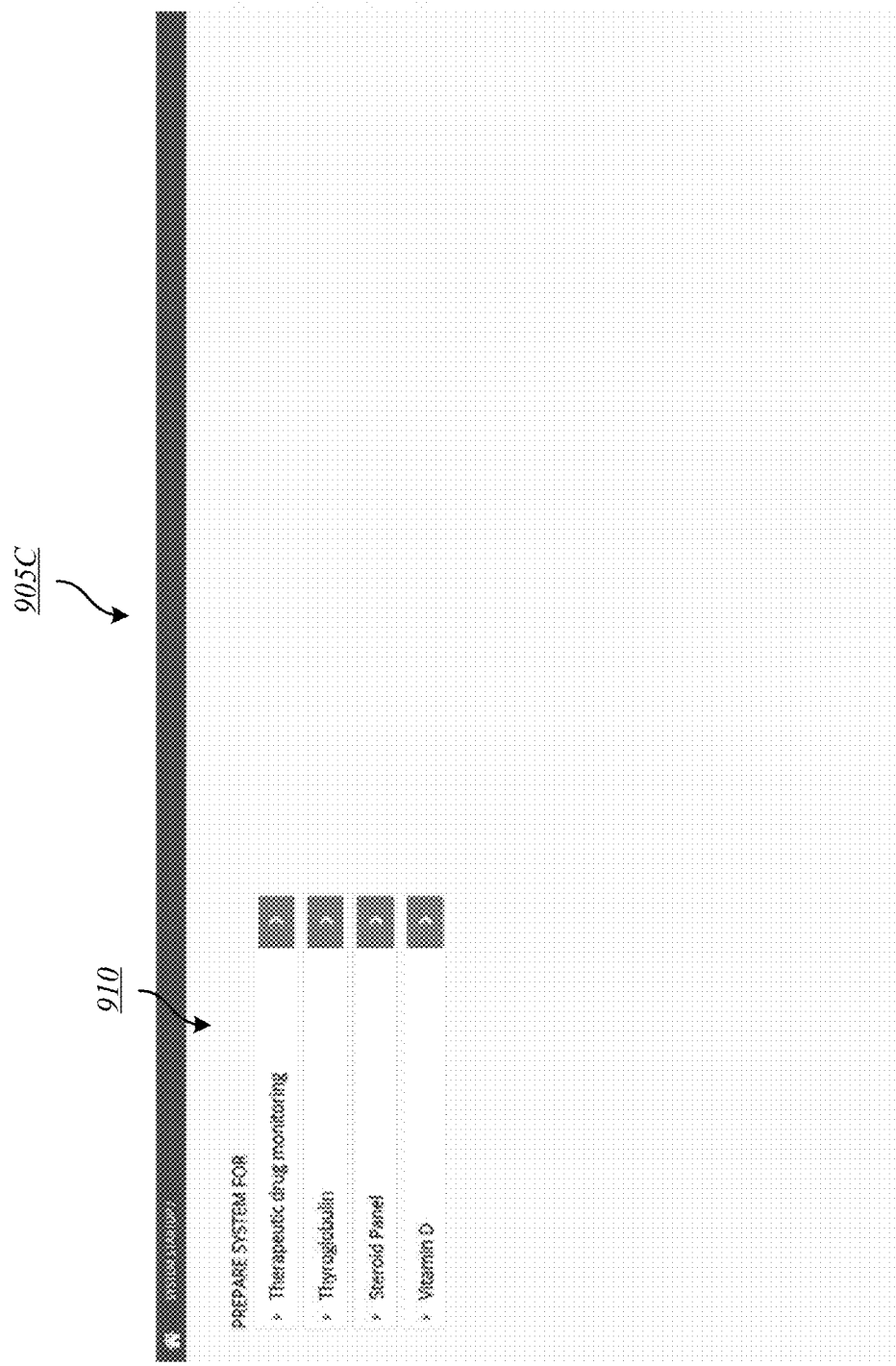
Figure 9D:
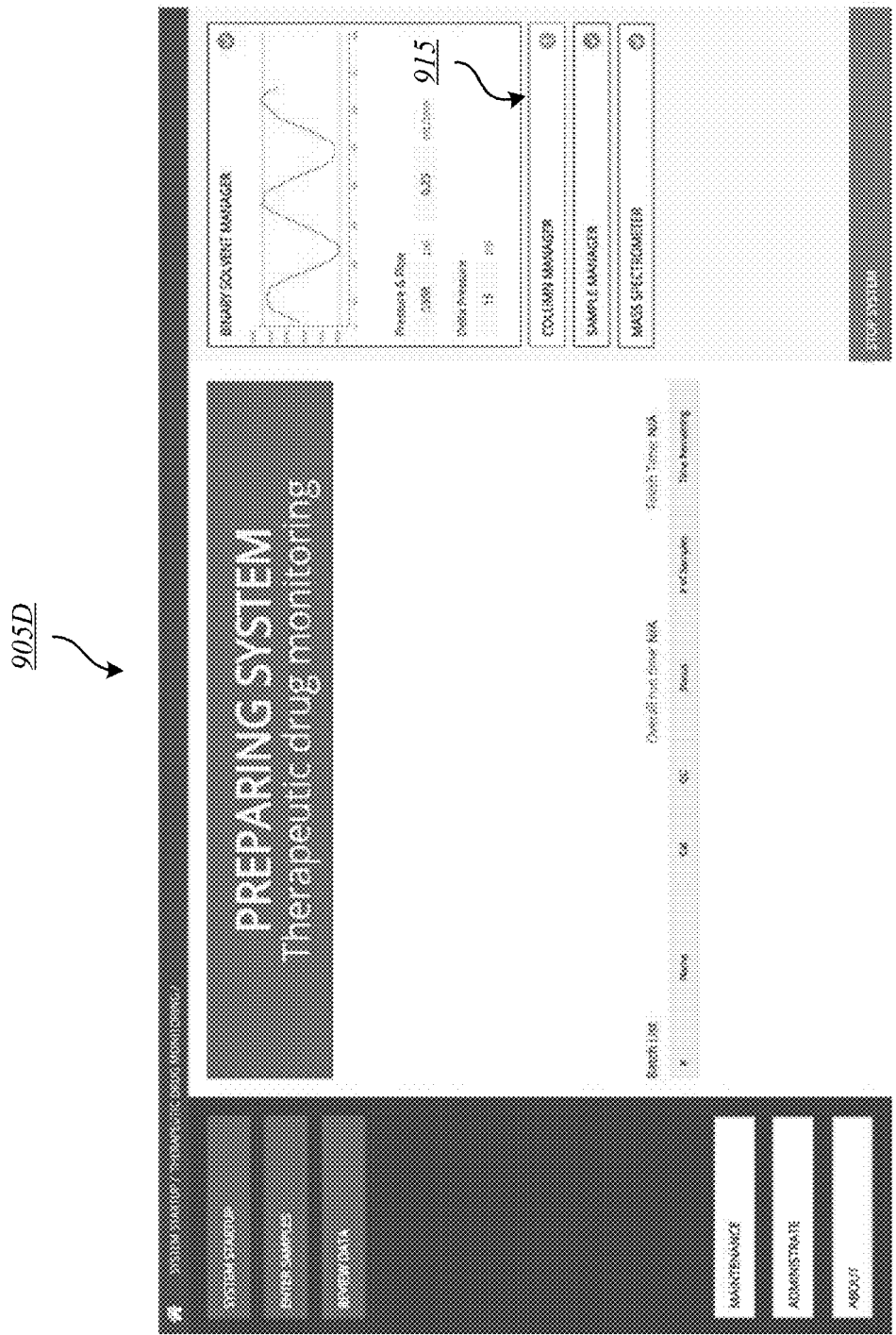
Figure 9E:
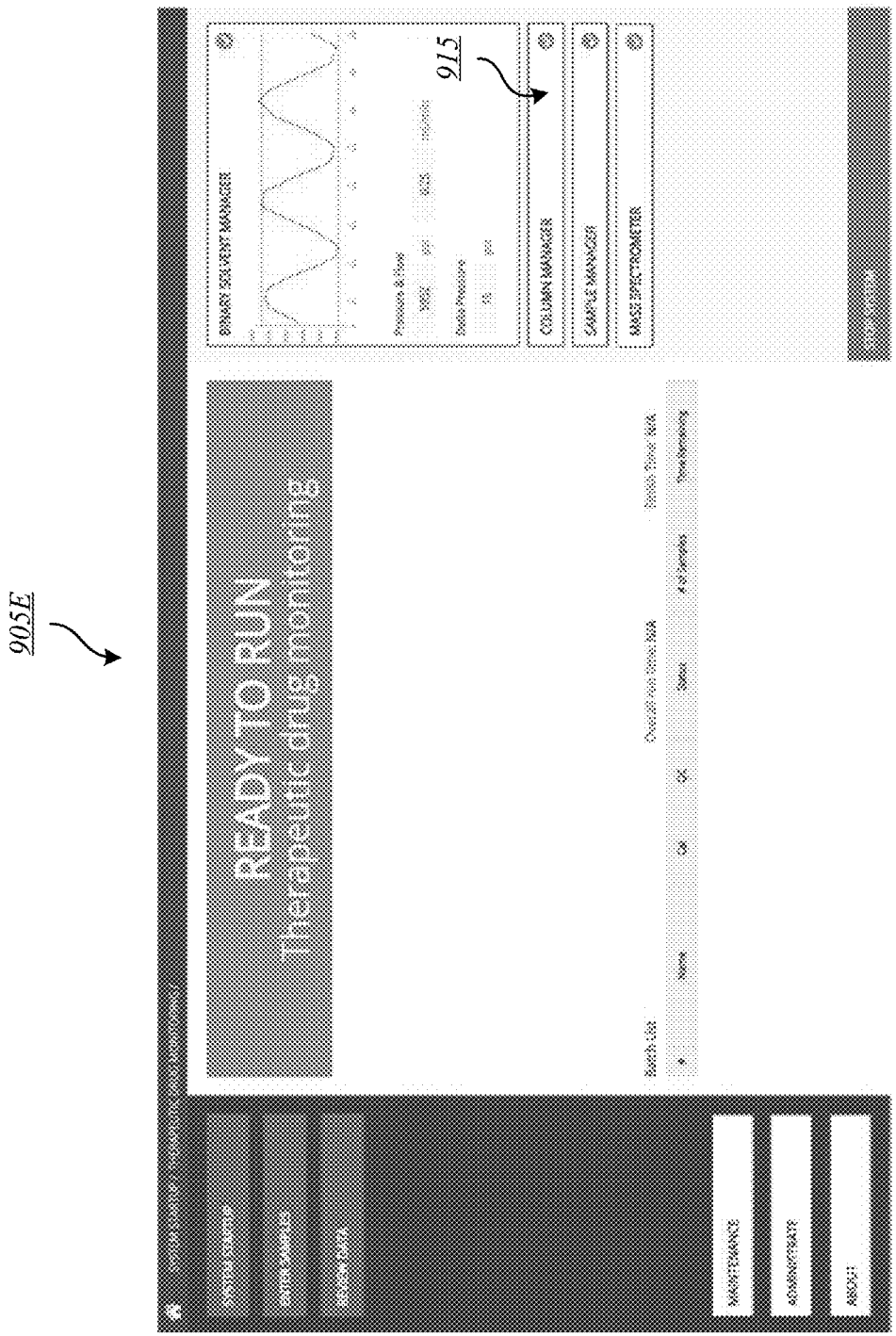
Figure 9F:
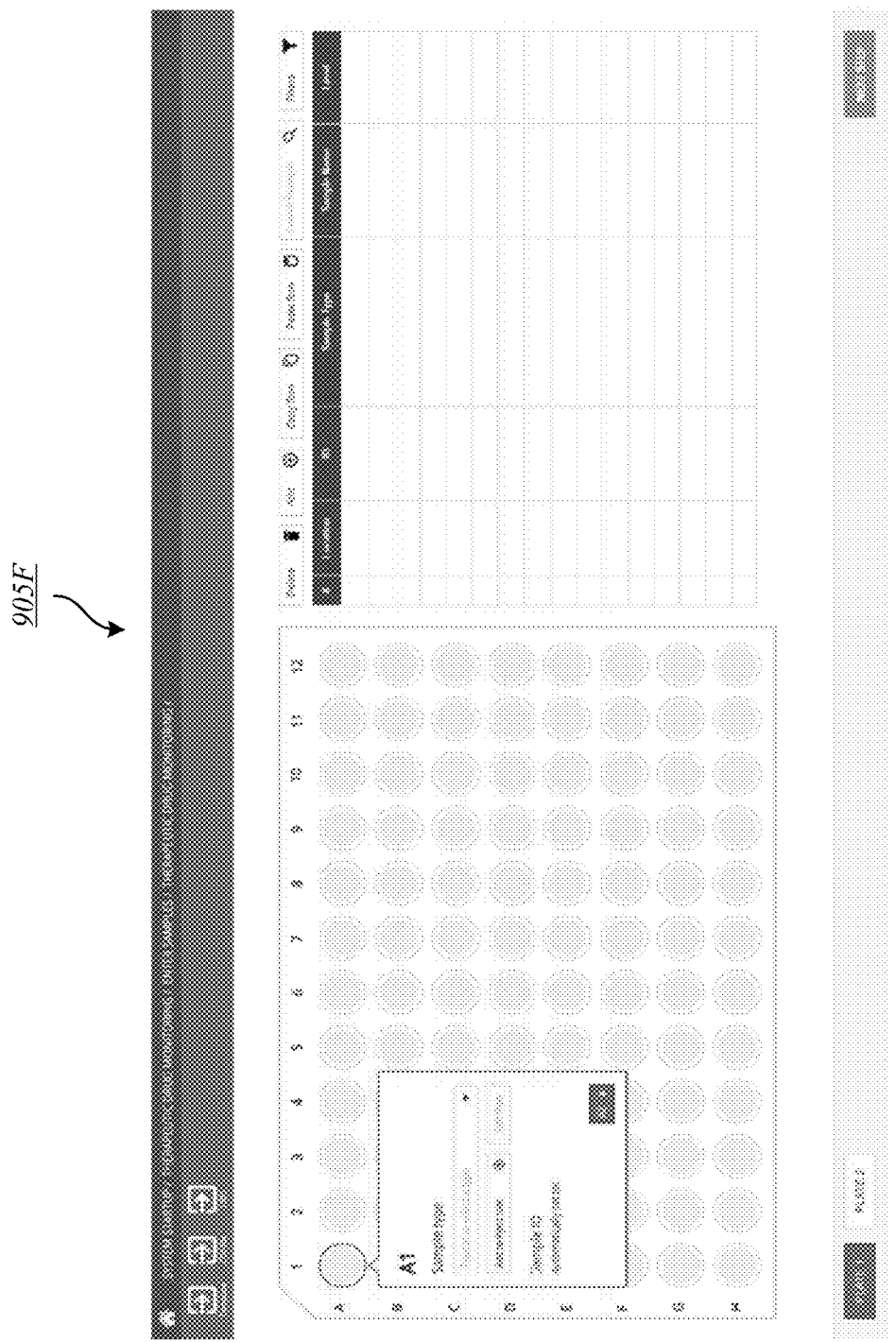

FIG. 9C depicts screen 905C showing analytical services or methods 910 that the LC-MS system may be prepared for. A user may select the appropriate service 910 for operating the LC-MS for the particular run. FIG. 11D depicts a screen 905D after the user has selected a service 910 on screen 905C (for example, a therapeutic drug monitoring service). As shown in FIG. 9D, analytical services application may provide statuses 915 of various system components. For example, the mass spectrometer and the sample manager are online and ready, while column manager is not yet available. Referring to FIG. 9E, once column manager has become available (and therefore, all of the monitored systems are indicated as being ready), screen 905E may indicate that the system is ready to run.

Figure 9G:
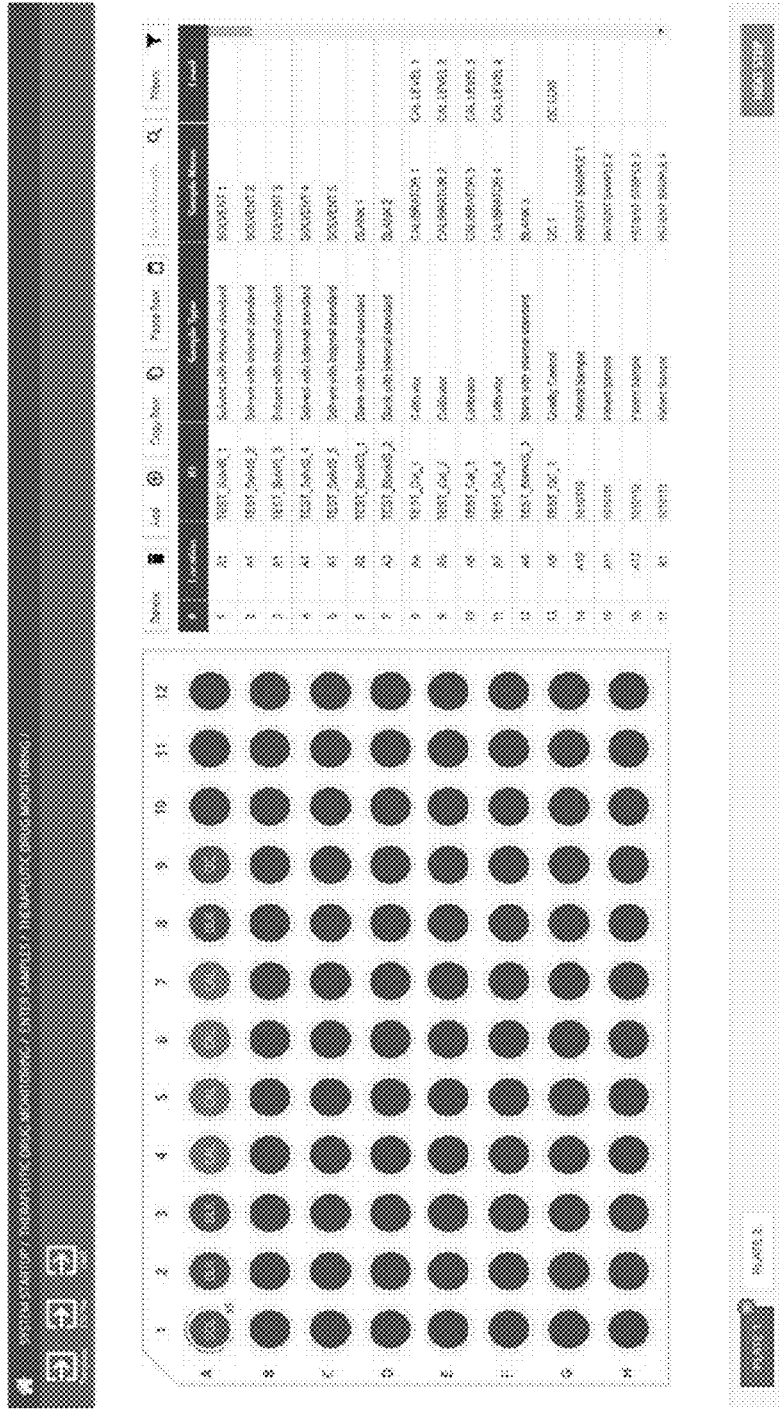
Figure 9H:
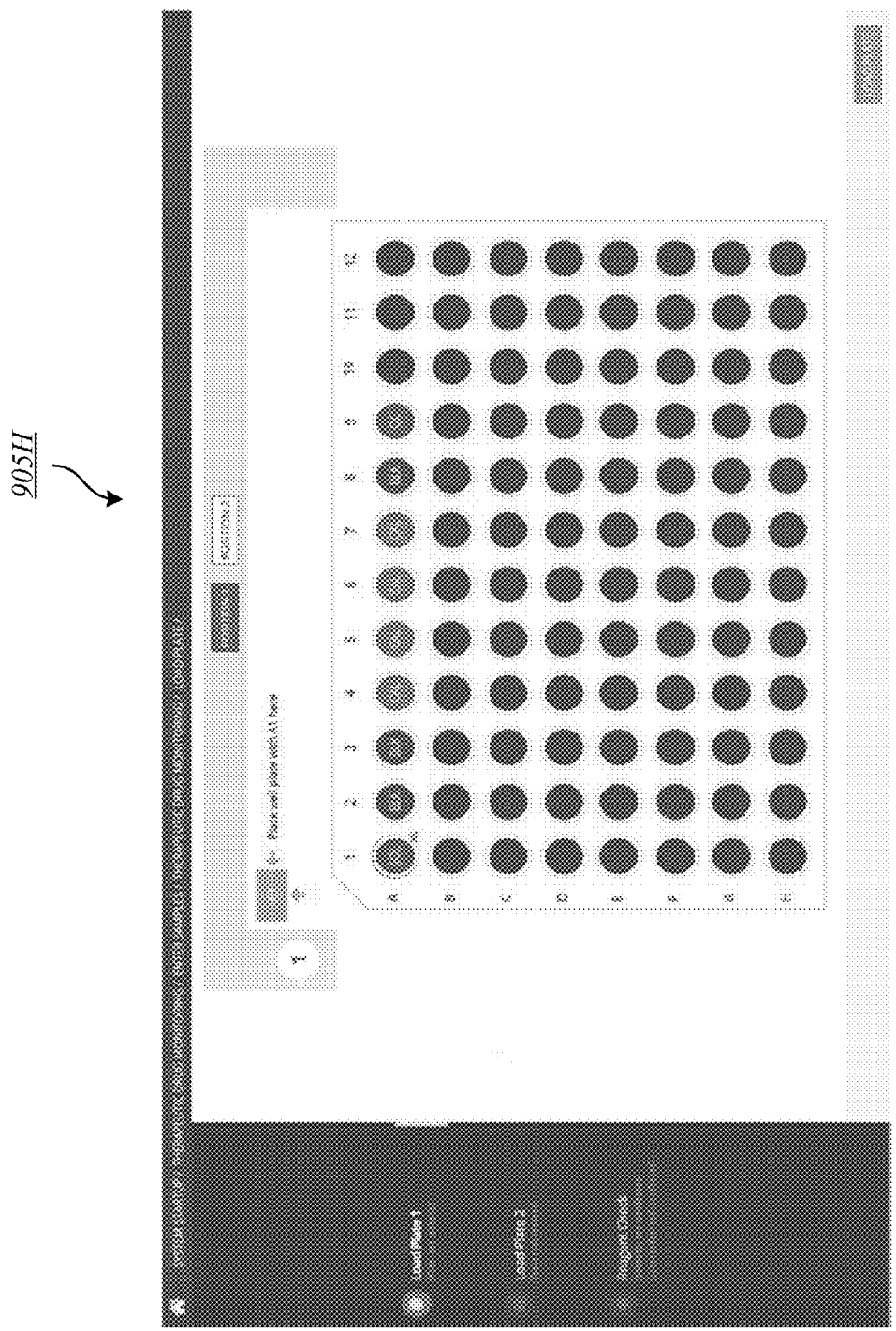
Figure 9I:
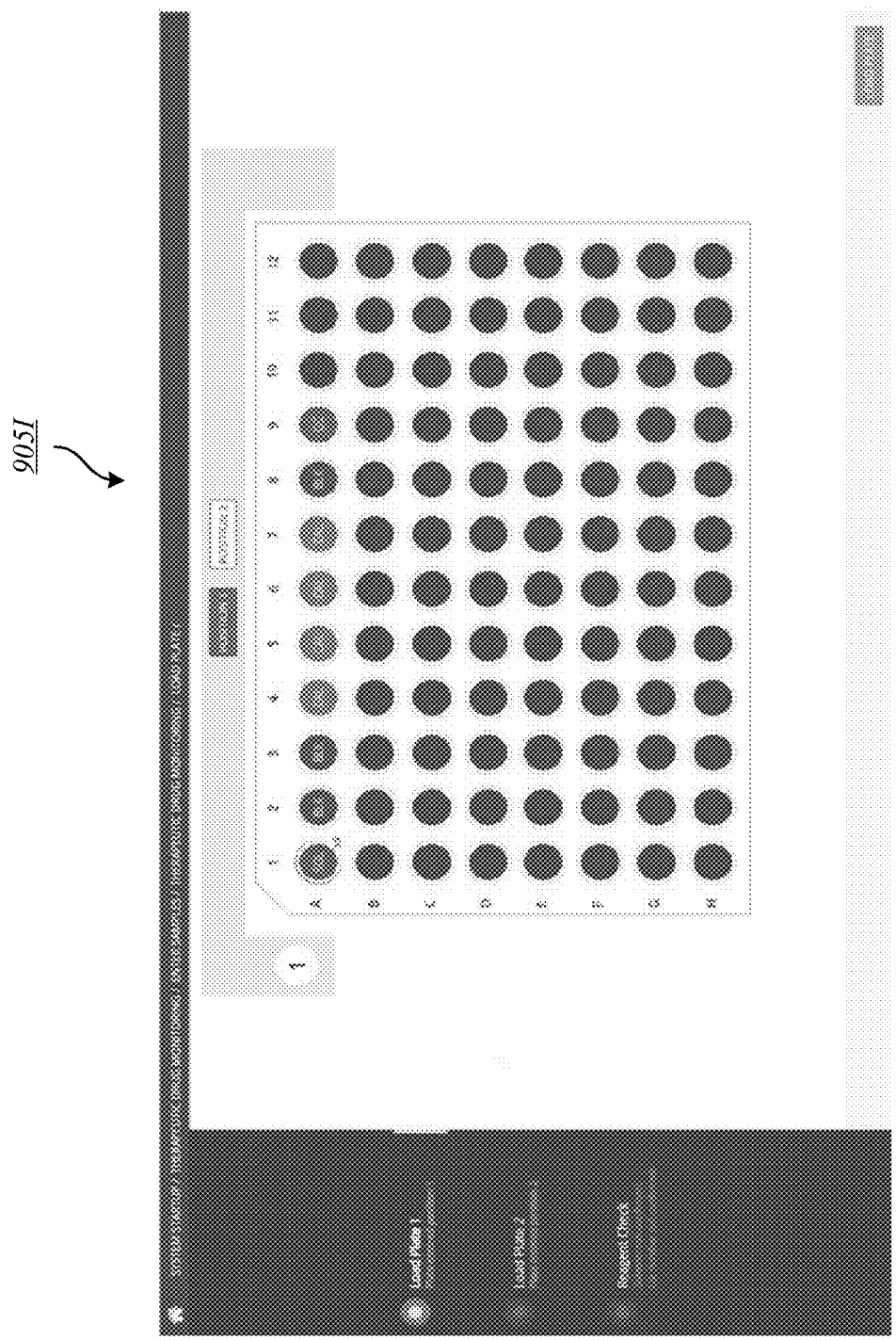
Figure 9J:
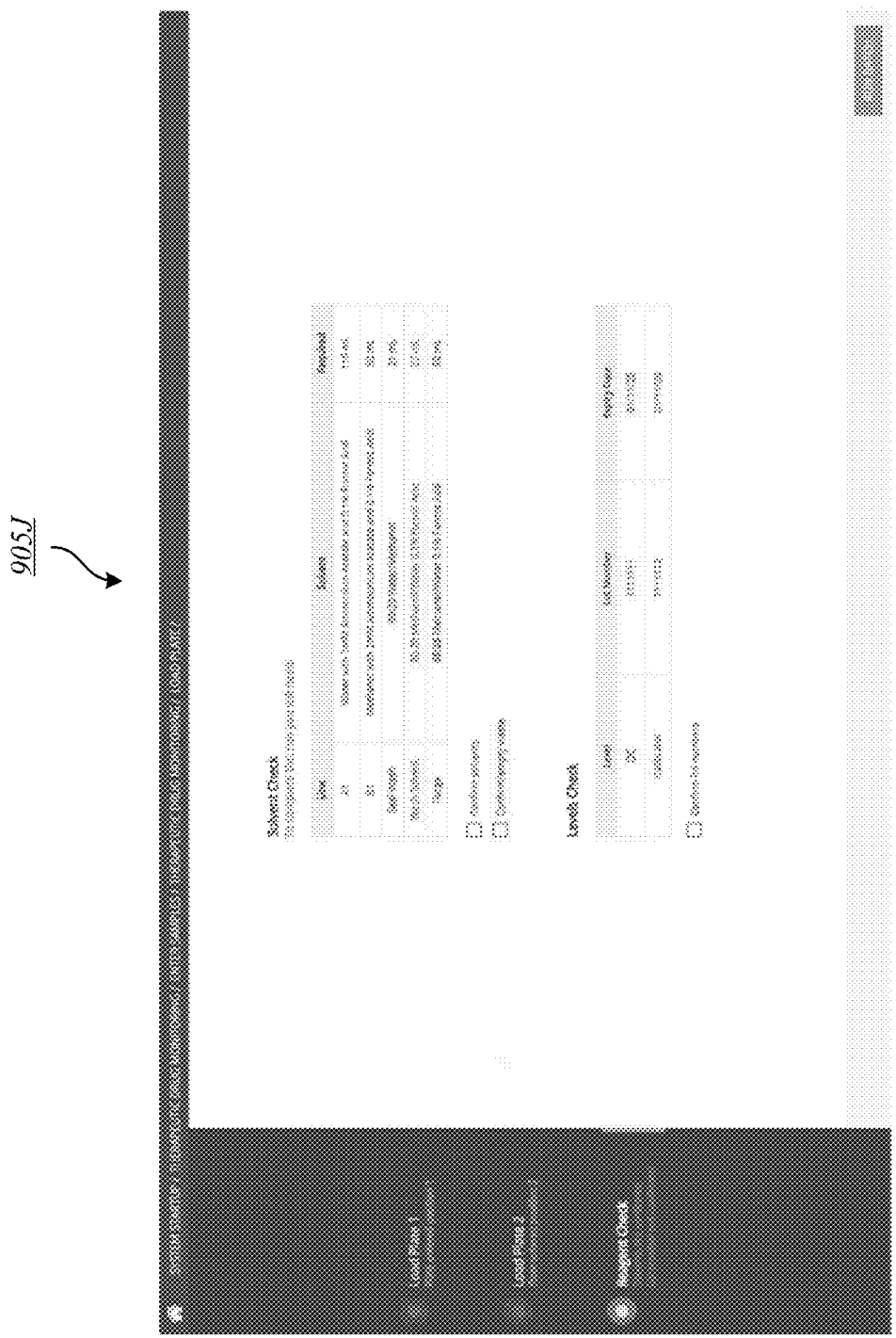
Figure 9K:
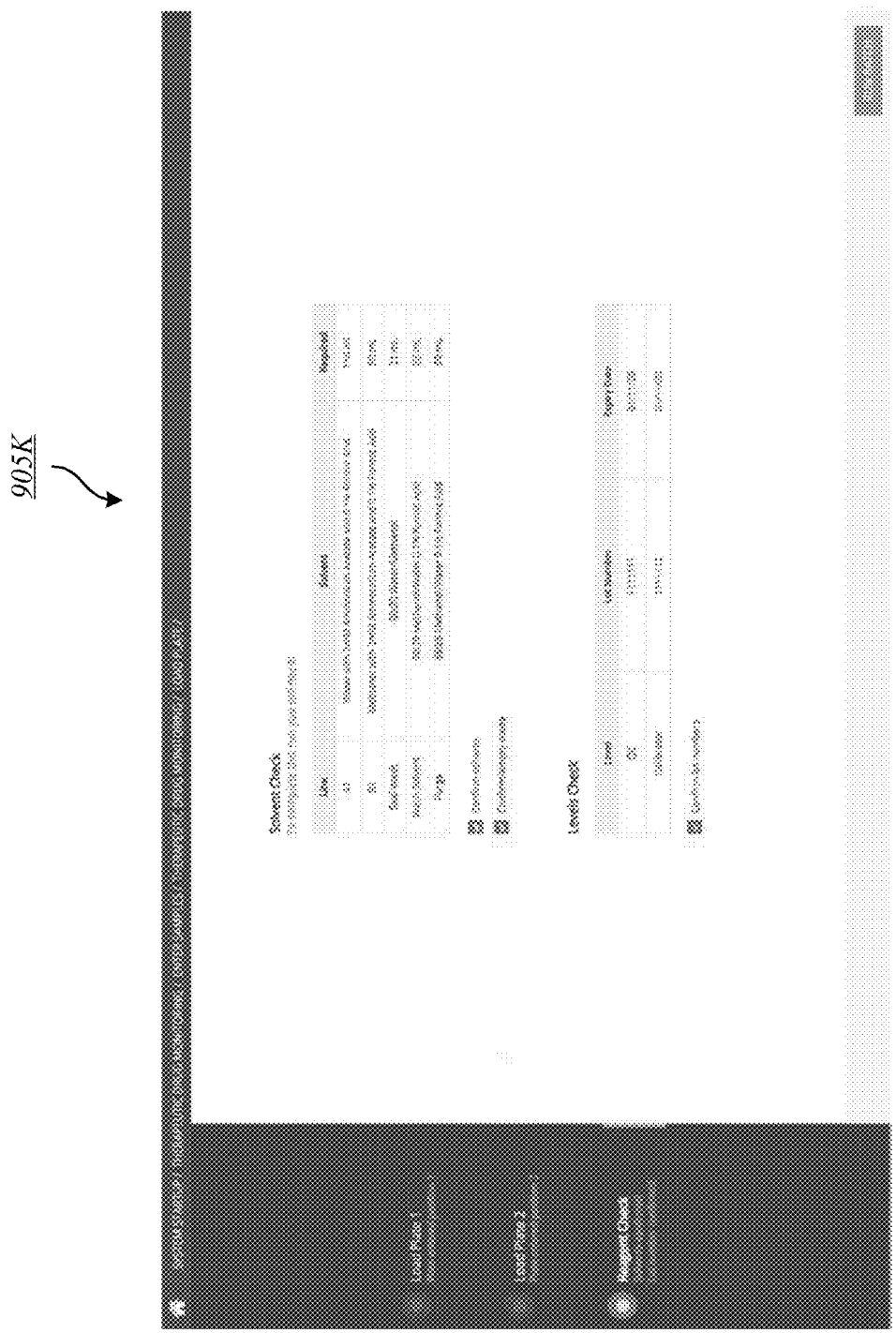

Referring to 9F, therein is depicted screen 905F showing a graphical representation of a sample plate that may be displayed responsive to selecting "Enter Samples" on screen 905E. Samples, including blanks, solvents, calibrators, and/or the like, may be entered manually or loaded via an electronic file stored locally, in a remote data system (for instance, a LIMS system), and/or the like. FIG. 9G depicts screen 905G showing a sample plate loaded via a LIMS file. Once the sample plate has been loaded, selection of "Next Step" on screen 905G may cause screen 905H of FIG. 9H to be displayed, depicting instructions to physically load a plate into the system. Screen 905I of FIG. 9I may be displayed following loading of the first plate. After loading all of the plates for the analysis, a reagent check may be performed as depicted in screen 905J of FIG. 9J. As shown in screen 905K of FIG. 9K, an operator may be required to confirm solvents, lot numbers, etc. associated with reagents used in the analytical method.

Figure 9L:
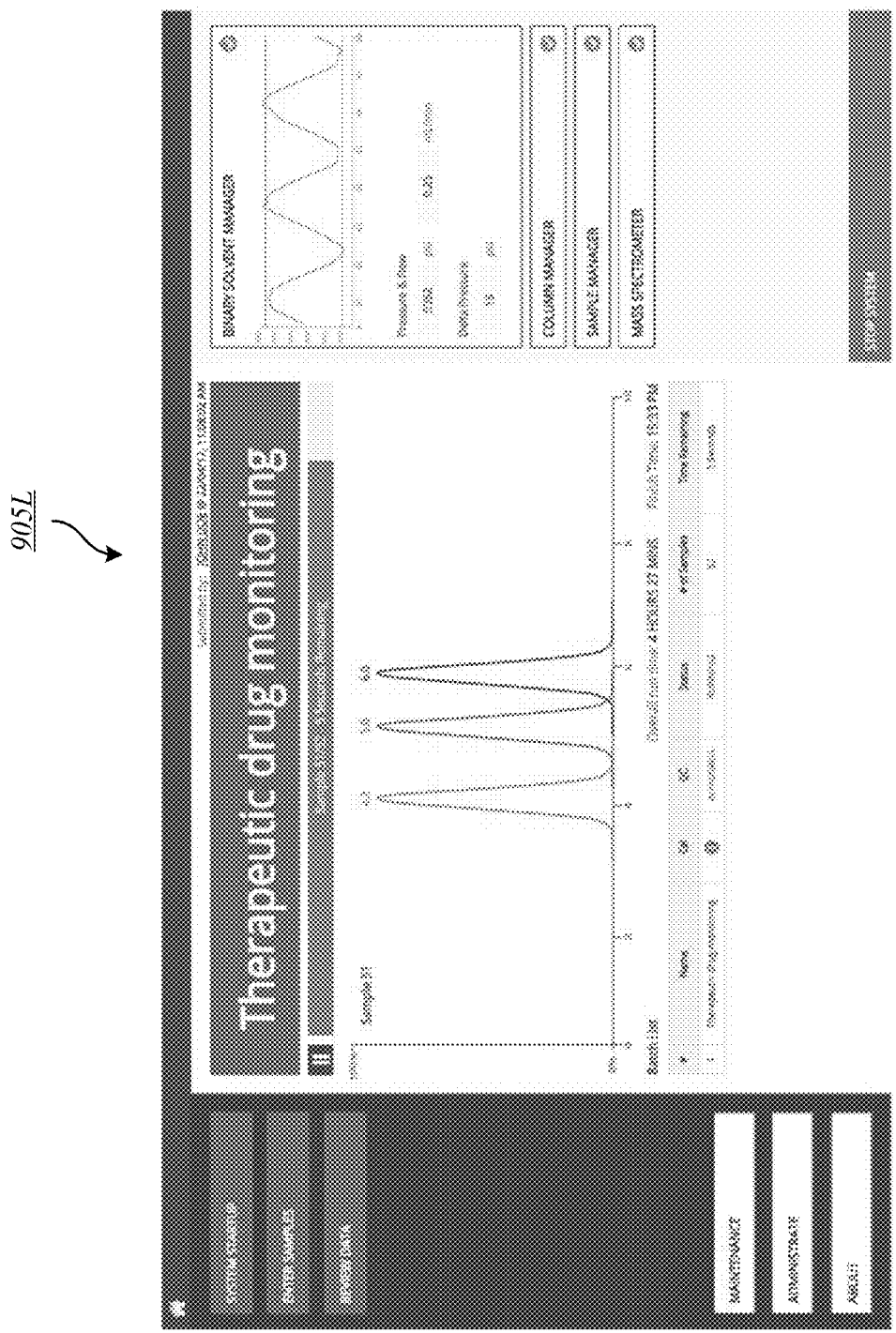
Figure 9M:
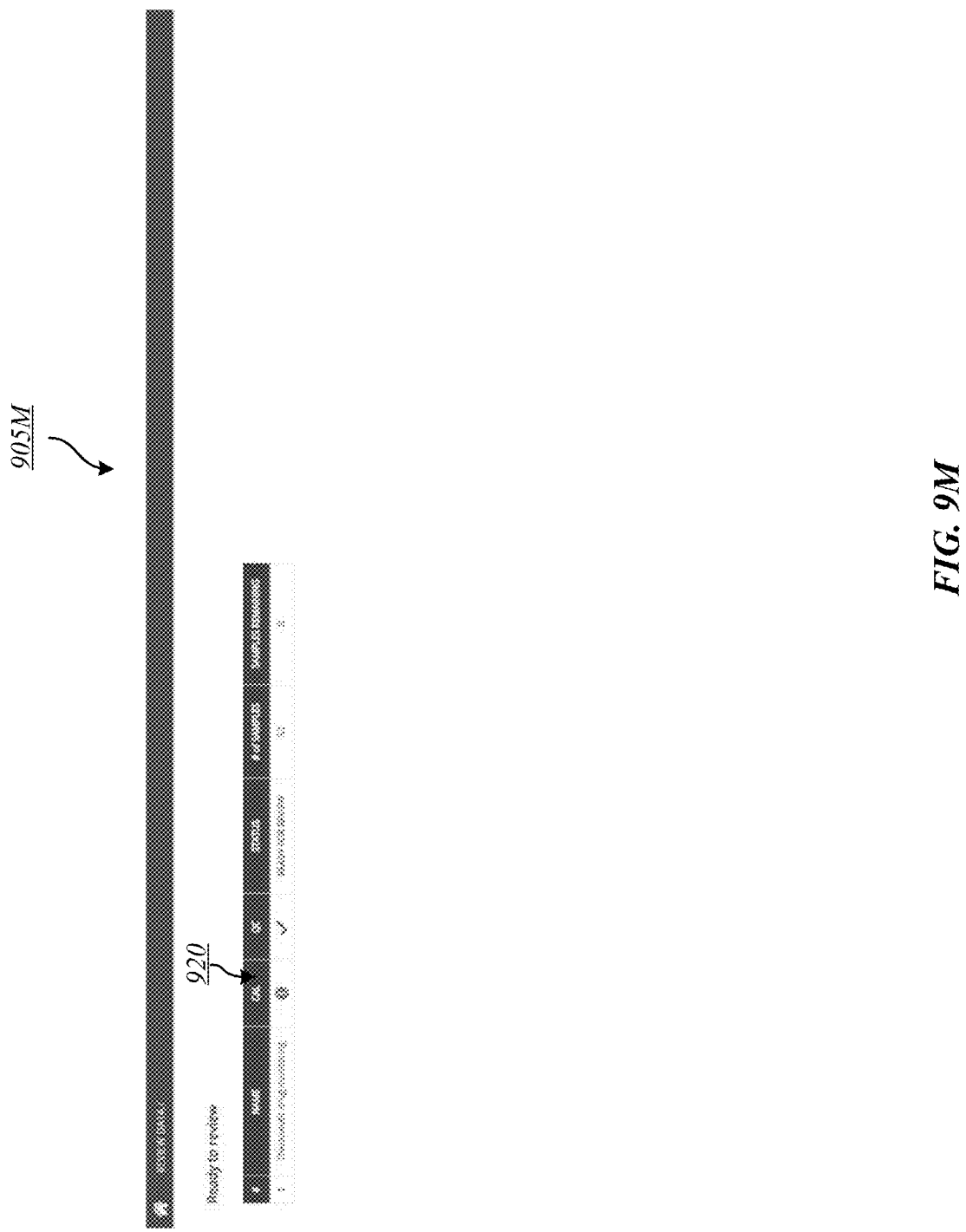
Figure 9N:
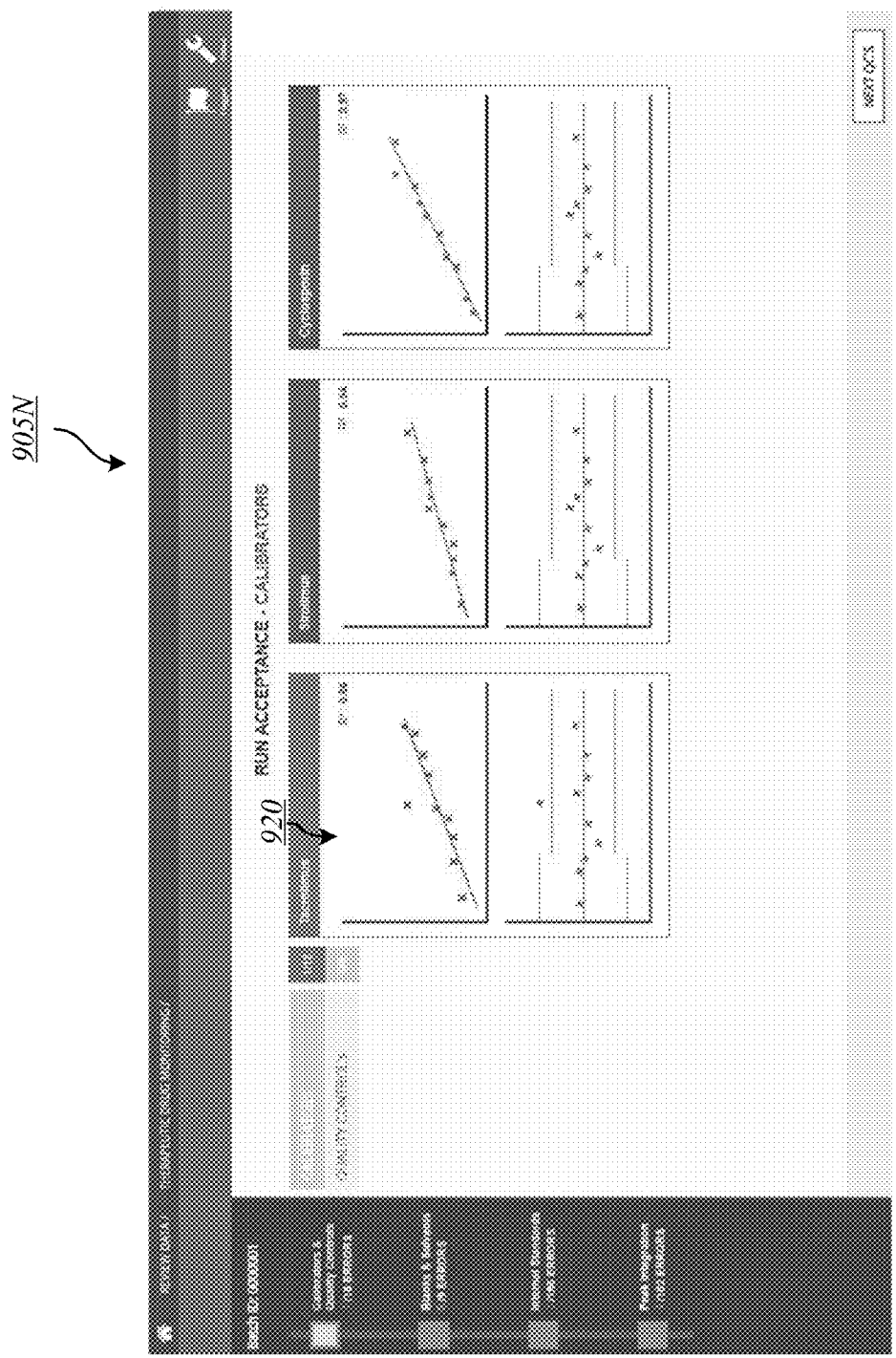
Figure 9O:
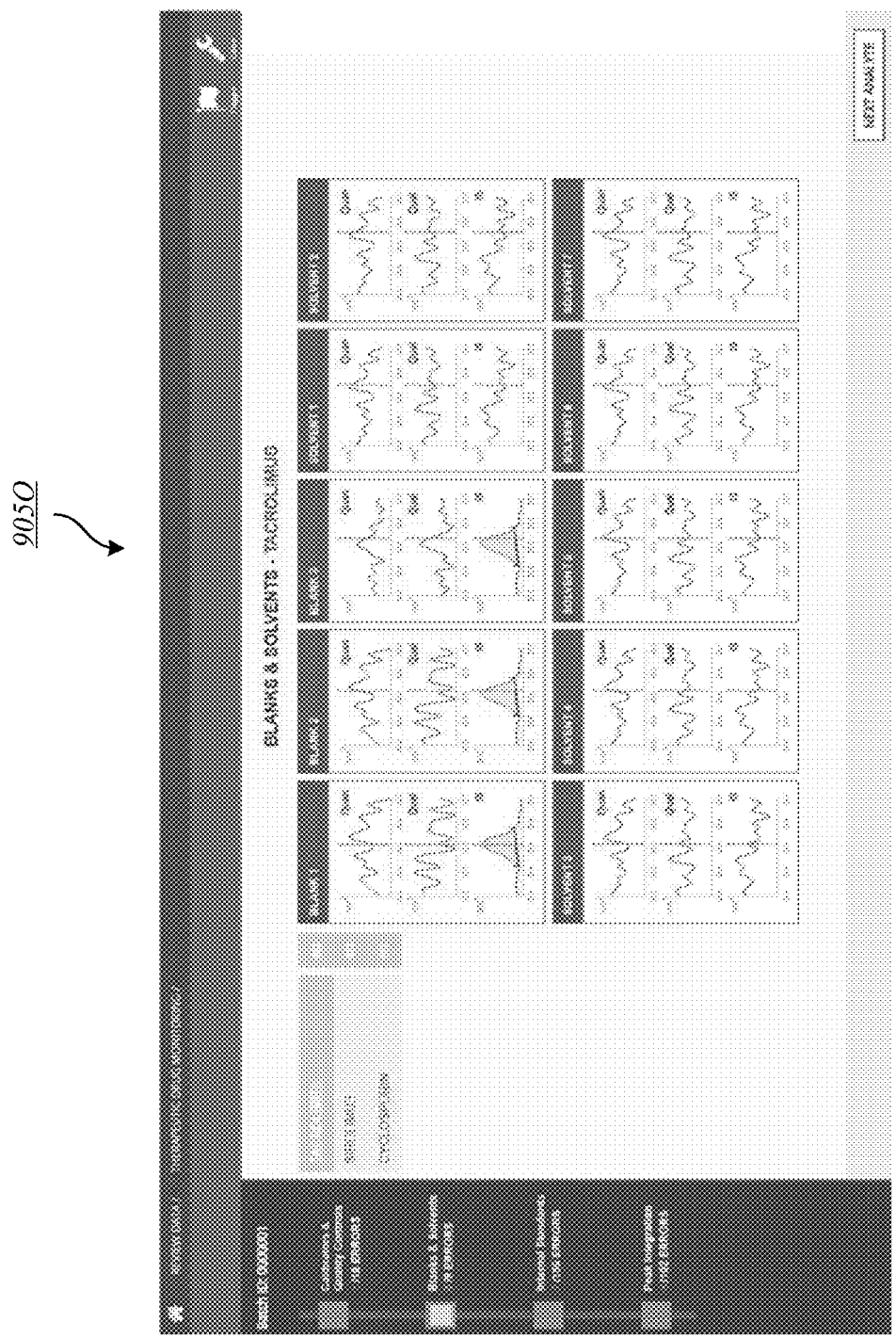
Figure 9P:
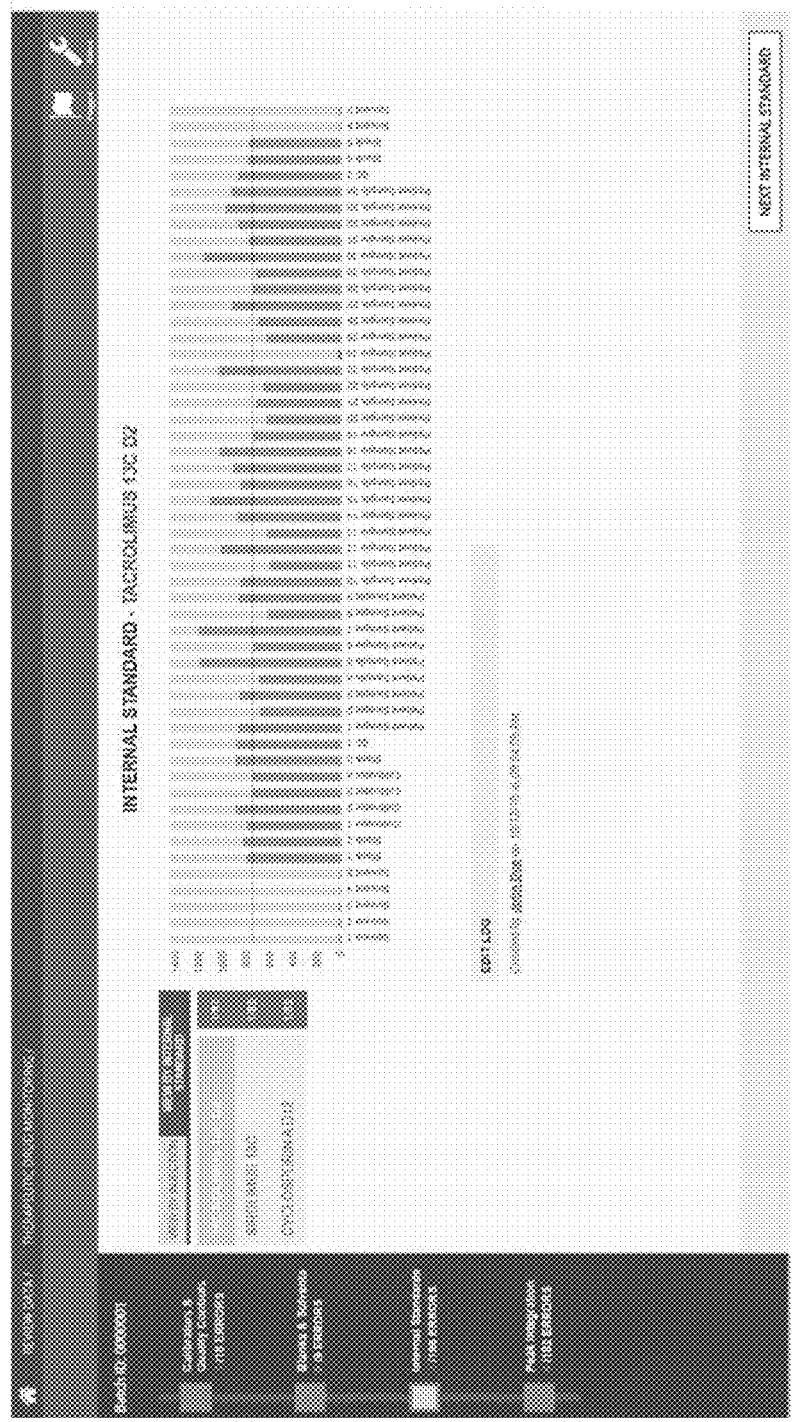
Figure 9Q:
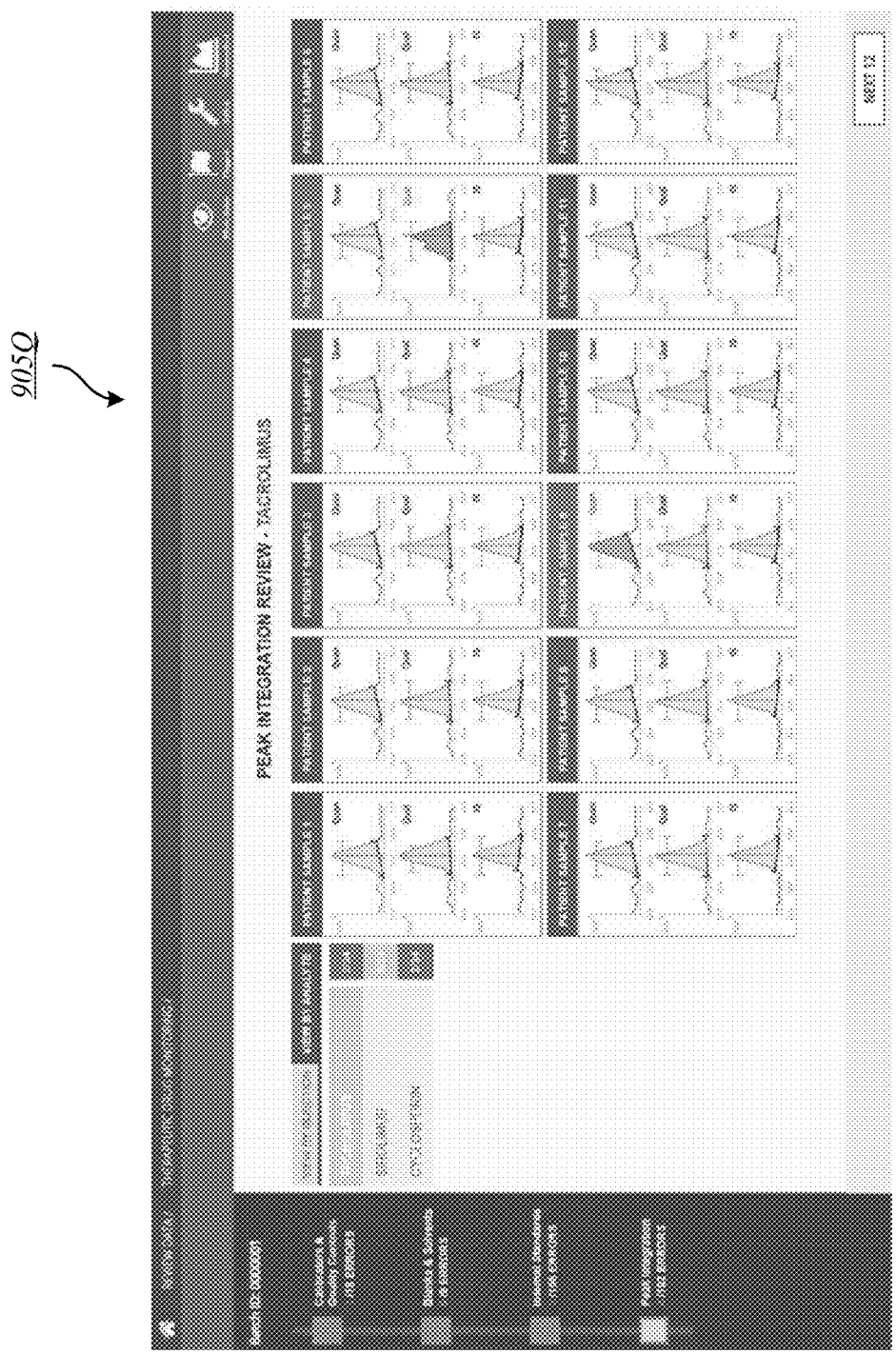
Figure 9R:
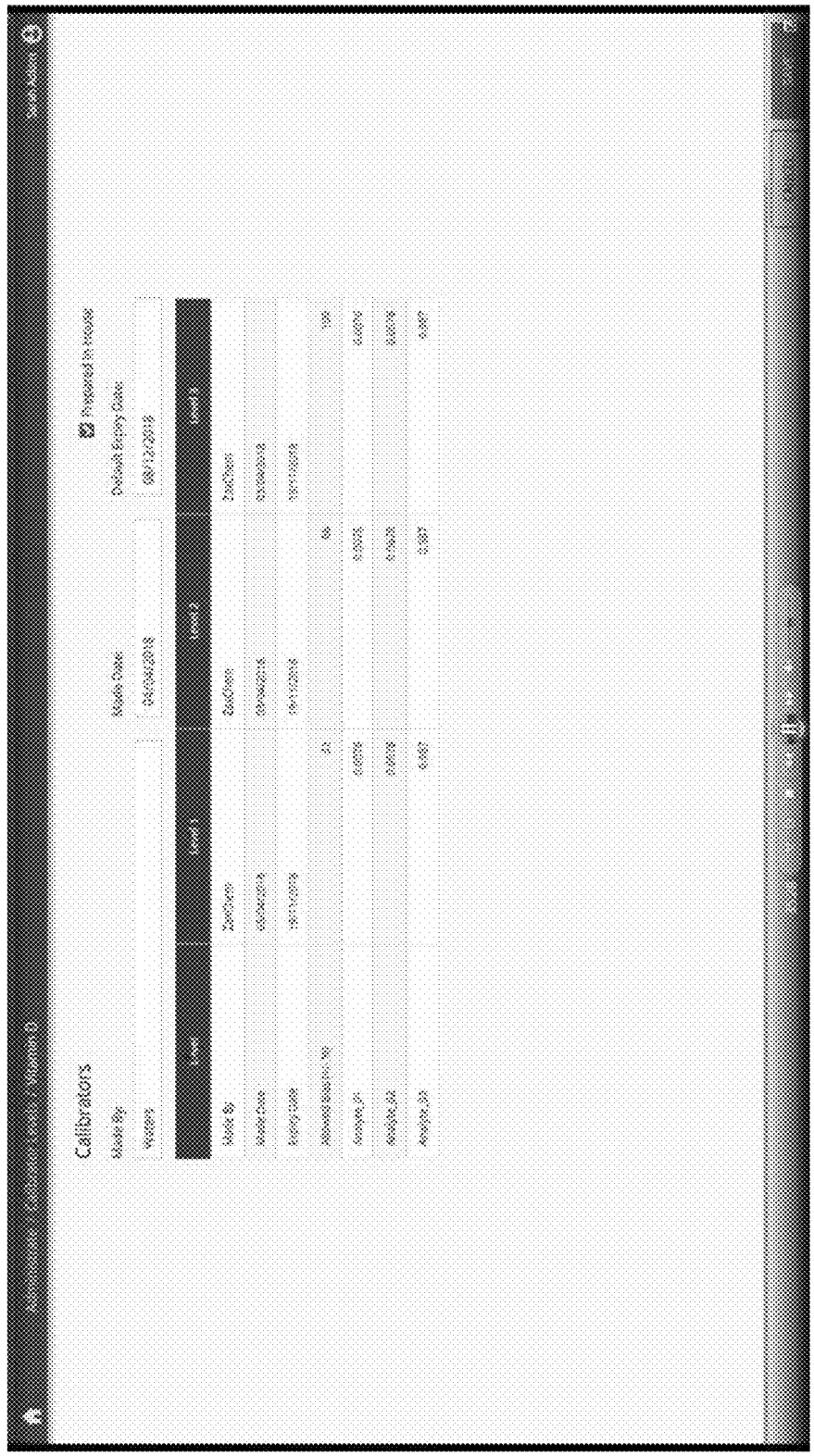
Figure 9S:
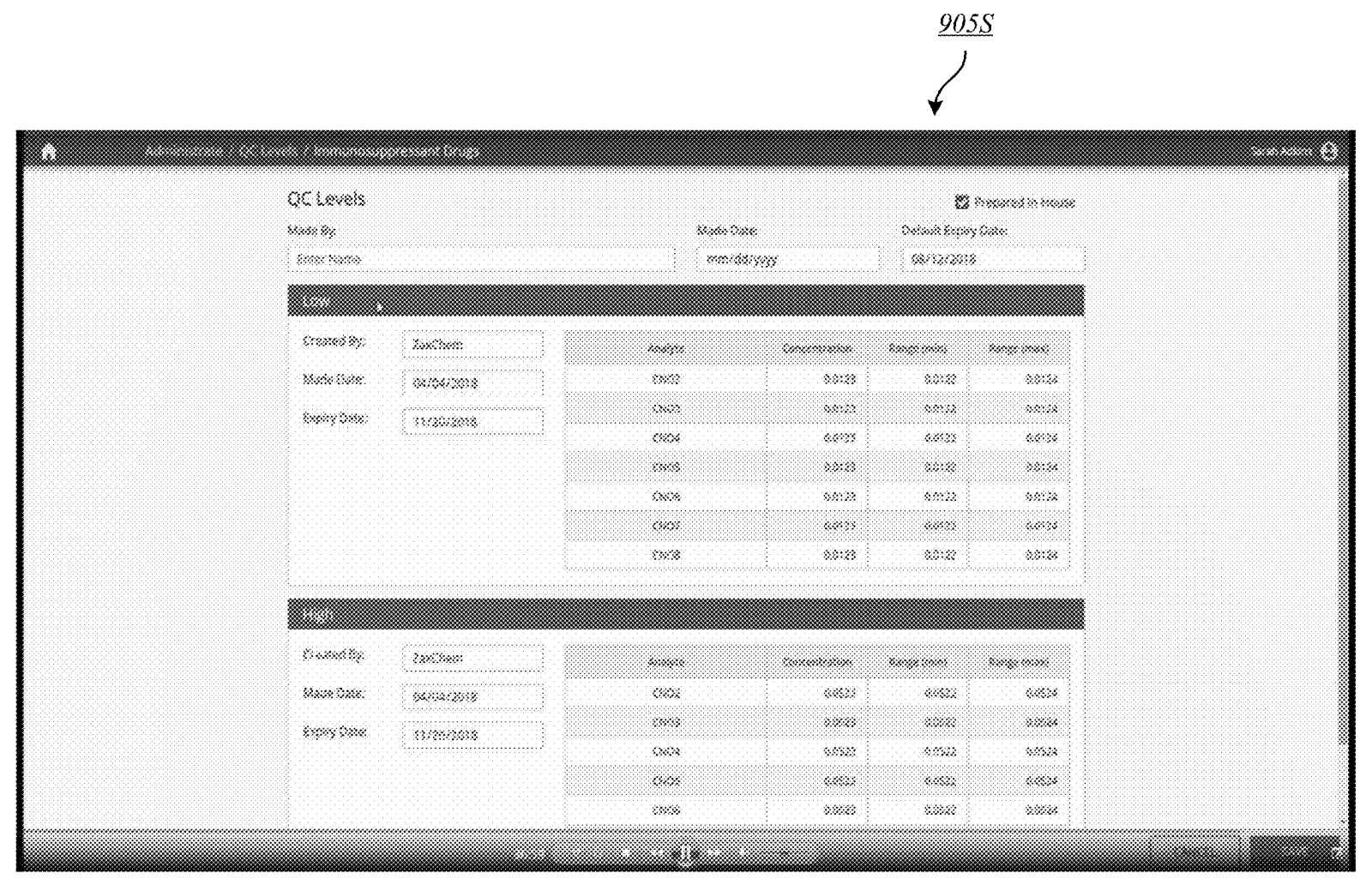

Referring to FIG. 9L, therein is depicted screen 905L showing the analytical service being performed on the LC-MS device showing, among other things, the samples and time remaining for the analytical service. Responsive to completion of the analytical service, screen 905M of FIG. 9M may be displayed, indicating that the associated data is ready to review. As shown in FIG. 9M, indicators 920 may be provided relating to the data associated with the analytical service, for example, indicating that there may be an issue with the corresponding calibration. Screen 905N of FIG. 9N depicts the calibrators corresponding to the analytical service, including a calibrator outside of tolerance 925. In some embodiments, screens depicting analytical data for blanks and solvents and/or internal standards may be provided as illustrated in screen 905O of FIG. 9O and screen 905P of FIG. 9P, respectively. An operator, with proper authorization, may view and modify peak integration for the analytical data as depicted in screen 905Q of FIG. 9Q. In various embodiments, any modifications made via screen 905Q may be recorded in a record associated with performance of the analytical service. As shown in screen 905R of FIG. 9R and 905S of FIG. 9S, an operator, with proper authorization, may enter and/or generate their own calibrators. The calibrators may be associated with various methods that may be generated and/or performed on the LC-MS device.

Exemplary and Non-Limiting Use Cases

Use Case I:

Description: a laboratory provides a test service using LC-MS (MRM) to separate, identify and quantify organic compounds contained in human biological liquid sample matrices (such as blood or urine) using manual sample information entry, and reporting using paper reports that are transcribed into LIS. Trigger: Laboratory Director implements routine LC-MS test in laboratory. Preconditions: LC-MS protocol and sample preparation method have been developed according to laboratory SOPs. Steps: 1. Analysts verifies device is in service; 2. Analysts selects appropriate test; 3. Analyst prepares LC-MS system for use; 4. Analyst performs system suitability test, and obtains PASS; 5. Analyst collects patient samples with worklist for analysis and assembles with any blanks, QCs and calibrators used in the batch; 6. Analyst provides LC-MS sample information to the LC-MS system by completing run list using barcode scanner to enter container ID for patient samples; 7. Analyst performs sample preparation on patient samples, blanks, QCs and calibrators to produce LC-MS samples in sample carrier; 8. Analyst loads LC-MS samples into sample carrier and places into LC-MS system; 9. Analyst executes analysis of LC-MS samples by starting injection sequence; 10. Analyst processes the data from the LC-MS injection sequence; 11. Super Analyst examines data, and makes adjustments to integration as necessary; 12. Supervisor approves/rejects results and releases for reporting; 13. Analyst prepares paper reports for laboratory records; 14. Analyst enters results into LIS manually for reporting to the person who ordered the test. Acceptance Criteria: A successful completion of a summative usability test with target completion and error rates for the workflow above.

Use Case II:

Description: Laboratory provides a high-volume test service using LC-MS (MRM)) to separate, identify and quantify organic compounds contained in human biological liquid sample matrices (such as blood or urine) using automated sample preparation, electronic import of sample information and export of results to LIS. Trigger: Laboratory Director implements routine high-volume LC-MS test in laboratory. Preconditions: LC-MS protocol and sample preparation method have been developed according to laboratory SOPs. Data transfer between sample preparation device and LIS has been established. Steps: 1. Analyst collects assembles patient samples, possibly against worklist generated by LIS; 2. Analyst prepares automated sample preparation device for use; 3. Analyst places patient samples including blanks, QCs and calibrator on liquid handler according to laboratory SOP; 4. Analyst starts sample preparation device to prepare LC-MS samples, and sample preparation device generates worklist for LC-MS system; 5. Analysts verifies device is in service; 6. Analysts selects appropriate test; 7. Analyst prepares LC-MS system for use; 8. Analyst performs system suitability test, and obtains PASS; 9. Analyst imports worklist from sample preparation device, and verifies sample locations; 10. Analyst loads LC-MS samples into LCMS system; 11. Analyst executes analysis of LC-MS samples by starting injection sequence; 12. Analyst processes the data from the LC-MS injection sequence; 13. Super Analyst examines data, and makes adjustments to integration as necessary; 14. Super Analyst approves/rejects results and releases for reporting; 15. Analyst exports data to LIS system. Acceptance Criteria: A successful completion of a summative usability test with target completion and error rates for the workflow above.

Use Case III:

Description: Laboratory provides a high-volume test service using LC-MS (flow injection, MRM) to identify and quantify (not separate) organic compounds contained in human biological liquid sample matrices (such as blood or urine) from dried bloodspots using automated sample preparation, electronic import of sample information and export of results to LIS. Trigger: Laboratory Director implements routine high-volume targeted screening service in the laboratory using LC-MS. Preconditions: LC-MS protocol and sample preparation method have been developed according to laboratory SOPs. Data transfer between sample preparation device and LIS has been established. Steps: 1. Analyst collects assembles patient samples, for example, possibly against worklist generated by LIS; 2. Analyst prepares automated sample preparation device for use, and initiates sample, preparation; 3. Analysts verifies device is in service; 4. Analysts selects appropriate test; 5. Analyst prepares LC-MS system for use; 6. Analyst performs system suitability test, and obtains PASS; 7. Analyst provides LC-MS sample information to the device by completing worklist [import from LIS, or sample preparation device] that incorporates QCs and blanks; 8. Analyst places LC-MS samples into LC-MS system; 9. Analyst executes analysis of samples by starting the injection sequence using flow injection with MRM; 10. Analyst processes the data from the LC-MS injection sequence using peak area ratios; 11. Supervisor reviews data, and approves/rejects results based on QC results and absolute intensity for IS, and releases for reporting; 12. Analyst exports results to LIS. Acceptance Criteria: A successful completion of a summative usability test with target completion and error rates for the workflow above.

Figure 10:
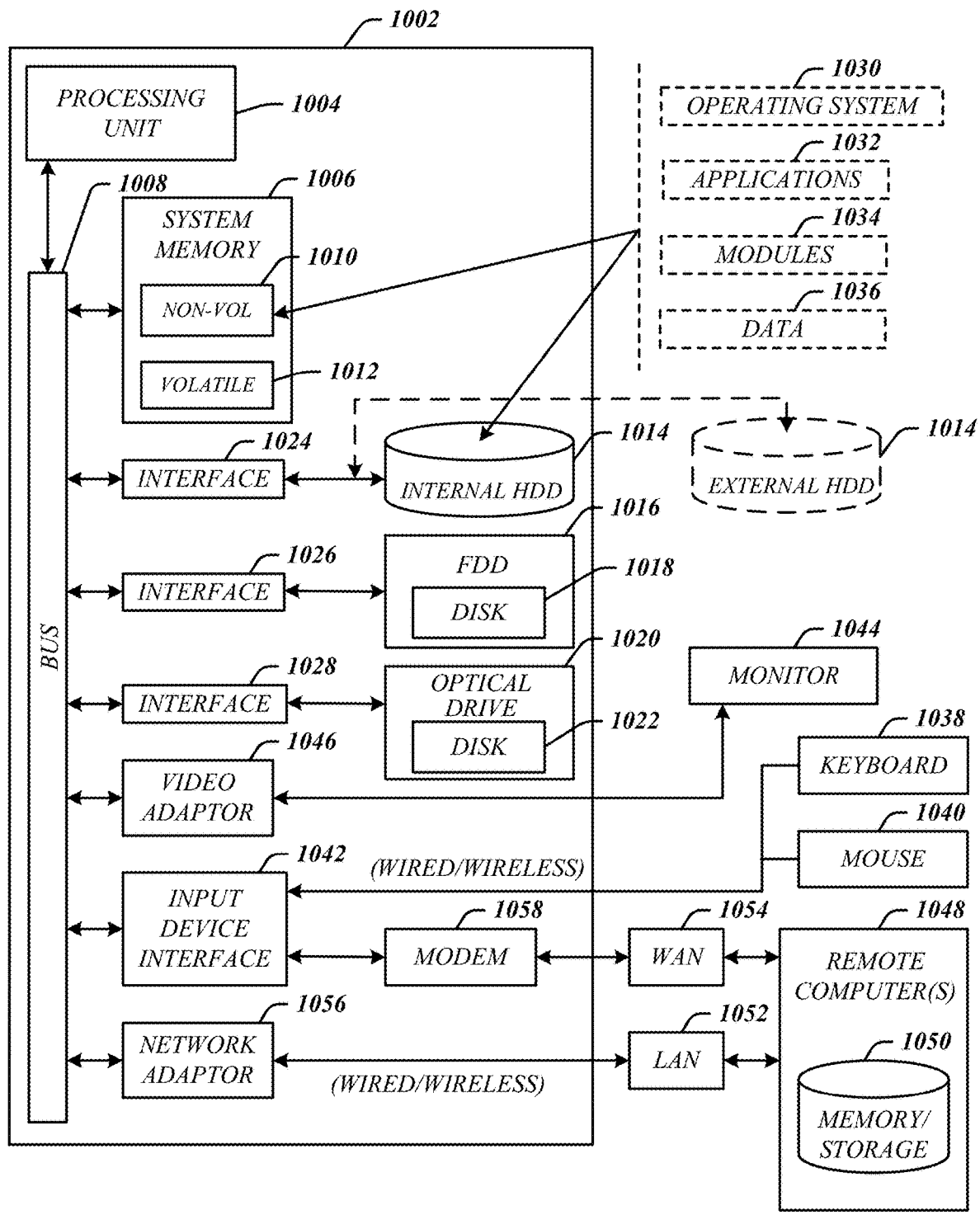
FIG. 10 illustrates an embodiment of a computing architecture.

FIG. 10 illustrates an embodiment of an exemplary computing architecture 1000 suitable for implementing various embodiments as previously described. In various embodiments, the computing architecture 1000 may comprise or be implemented as part of an electronic device. In some embodiments, the computing architecture 1000 may be representative, for example, of computing device 110 and/or 410. The embodiments are not limited in this context.

As used in this application, the terms "system" and "component" and "module" are intended to refer to a computer-related entity, either hardware, a combination of hardware and software, software, or software in execution, examples of which are provided by the exemplary computing architecture 1000. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

The computing architecture 1000 includes various common computing elements, such as one or more processors, multi-core processors, co-processors, memory units, chipsets, controllers, peripherals, interfaces, oscillators, timing devices, video cards, audio cards, multimedia input/output (I/O) components, power supplies, and so forth. The embodiments, however, are not limited to implementation by the computing architecture 1000.

As shown in FIG. 10, the computing architecture 1000 comprises a processing unit 1004, a system memory 1006 and a system bus 10010. The processing unit 1004 can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Celeron®, Core (2) Duo®, Itanium®, Pentium®, Xeon®, and XScale® processors; and similar processors. Dual microprocessors, multi-core processors, and other multi-processor architectures may also be employed as the processing unit 1004.

The system bus 10010 provides an interface for system components including, but not limited to, the system memory 1006 to the processing unit 1004. The system bus 10010 can be any of several types of bus structure that may further interconnect to a memory bus (with or without a memory controller), a peripheral bus, and a local bus using any of a variety of commercially available bus architectures. Interface adapters may connect to the system bus 10010 via a slot architecture. Example slot architectures may include without limitation Accelerated Graphics Port (AGP), Card Bus, (Extended) Industry Standard Architecture ((E)ISA), Micro Channel Architecture (MCA), NuBus, Peripheral Component Interconnect (Extended) (PCI(X)), PCI Express, Personal Computer Memory Card International Association (PCMCIA), and the like.

The system memory 1006 may include various types of computer-readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory, solid state drives (SSD) and any other type of storage media suitable for storing information. In the illustrated embodiment shown in FIG. 10, the system memory 1006 can include non-volatile memory 1010 and/or volatile memory 1012. A basic input/output system (BIOS) can be stored in the non-volatile memory 1010.

The computer 1002 may include various types of computer-readable storage media in the form of one or more lower speed memory units, including an internal (or external) hard disk drive (HDD) 1014, a magnetic floppy disk drive (FDD) 1016 to read from or write to a removable magnetic disk 10110, and an optical disk drive 1020 to read from or write to a removable optical disk 1022 (e.g., a CD-ROM or DVD). The HDD 1014, FDD 1016 and optical disk drive 1020 can be connected to the system bus 10010 by a HDD interface 1024, an FDD interface 1026 and an optical drive interface 10210, respectively. The HDD interface 1024 for external drive implementations can include at least one or both of Universal Serial Bus (USB) and IEEE 13104 interface technologies.

The drives and associated computer-readable media provide volatile and/or nonvolatile storage of data, data structures, computer-executable instructions, and so forth. For example, a number of program modules can be stored in the drives and memory units 1010, 1012, including an operating system 1030, one or more application programs 1032, other program modules 1034, and program data 1036. In one embodiment, the one or more application programs 1032, other program modules 1034, and program data 1036 can include, for example, the various applications and/or components of computing device 110 and/or 410.

A user can enter commands and information into the computer 1002 through one or more wire/wireless input devices, for example, a keyboard 10310 and a pointing device, such as a mouse 1040. Other input devices may include microphones, infra-red (IR) remote controls, radio-frequency (RF) remote controls, game pads, stylus pens, card readers, dongles, finger print readers, gloves, graphics tablets, joysticks, keyboards, retina readers, touch screens (e.g., capacitive, resistive, etc.), trackballs, trackpads, sensors, styluses, and the like. These and other input devices are often connected to the processing unit 1004 through an input device interface 1042 that is coupled to the system bus 10010, but can be connected by other interfaces such as a parallel port, IEEE 1394 serial port, a game port, a USB port, an IR interface, and so forth.

A monitor 1044 or other type of display device is also connected to the system bus 10010 via an interface, such as a video adaptor 1046. The monitor 1044 may be internal or external to the computer 802. In addition to the monitor 1044, a computer typically includes other peripheral output devices, such as speakers, printers, and so forth.

The computer 1002 may operate in a networked environment using logical connections via wire and/or wireless communications to one or more remote computers, such as a remote computer 10410. The remote computer 10410 can be a workstation, a server computer, a router, a personal computer, portable computer, microprocessor-based entertainment appliance, a peer device or other common network node, and typically includes many or all of the elements described relative to the computer 1002, although, for purposes of brevity, only a memory/storage device 1050 is illustrated. The logical connections depicted include wire/wireless connectivity to a local area network (LAN) 1052 and/or larger networks, for example, a wide area network (WAN) 1054. Such LAN and WAN networking environments are commonplace in offices and companies, and facilitate enterprise-wide computer networks, such as intranets, all of which may connect to a global communications network, for example, the Internet.

When used in a LAN networking environment, the computer 1002 is connected to the LAN 1052 through a wire and/or wireless communication network interface or adaptor 1056. The adaptor 1056 can facilitate wire and/or wireless communications to the LAN 1052, which may also include a wireless access point disposed thereon for communicating with the wireless functionality of the adaptor 1056.

When used in a WAN networking environment, the computer 1002 can include a modem 10510, or is connected to a communications server on the WAN 1054, or has other means for establishing communications over the WAN 1054, such as by way of the Internet. The modem 10510, which can be internal or external and a wire and/or wireless device, connects to the system bus 10010 via the input device interface 1042. In a networked environment, program modules depicted relative to the computer 1002, or portions thereof, can be stored in the remote memory/storage device 1050. It will be appreciated that the network connections shown are exemplary and other means of establishing a communications link between the computers can be used.

The computer 1002 is operable to communicate with wire and wireless devices or entities using the IEEE 802 family of standards, such as wireless devices operatively disposed in wireless communication (e.g., IEEE 802.16 over-the-air modulation techniques). This includes at least Wi-Fi (or Wireless Fidelity), WiMax, and Bluetooth™ wireless technologies, among others. Thus, the communication can be a predefined structure as with a conventional network or simply an ad hoc communication between at least two devices. Wi-Fi networks use radio technologies called IEEE 802.11x (a, b, g, n, etc.) to provide secure, reliable, fast wireless connectivity. A Wi-Fi network can be used to connect computers to each other, to the Internet, and to wire networks (which use IEEE 802.3-related media and functions).

Numerous specific details have been set forth herein to provide a thorough understanding of the embodiments. It will be understood by those skilled in the art, however, that the embodiments may be practiced without these specific details. In other instances, well-known operations, components, and circuits have not been described in detail so as not to obscure the embodiments. It can be appreciated that the specific structural and functional details disclosed herein may be representative and do not necessarily limit the scope of the embodiments.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. An apparatus, comprising:
at least one memory; and
logic coupled to the at least one memory, the logic configured to cause the apparatus to:
perform an analytical service on a primary analytical device, wherein the analytical service comprises an analytical method for a sample analysis and process information associated with for performing the analytical method on the primary analytical device,
receive acceptance of the analytical service in response to determining that the analytical service operates correctly on the primary analytical device, and
generate an analytical services package for the analytical service, the analytical services package configured to facilitate performance of the analytical service on a client analytical device that has a reduced number of options or configurations as compared to the primary analytical device, the analytical services package comprising a status of the analytical service, the status comprising an approval status of the analytical service that includes a type of use for which the analytical service is approved.

2. The apparatus of claim 1, at least a portion of the analytical services package is immutable.

3. The apparatus of claim 1, the primary analytical device comprising a liquid chromatography (LC) device.

4. The apparatus of claim 1, the primary analytical device comprising a mass spectrometer (MS) device.

5. The apparatus of claim 1, the analytical services package comprising a security level of an operator permitted to run the analytical service.

6. The apparatus of claim 1, the logic to:
access the analytical services package, and
provide the analytical services package to the client analytical device for performance of the analytical service on the client device.

7. The apparatus of claim 1, the logic to set an acceptance variable of the analytical services package to an accepted value responsive to acceptance of the analytical services package.

8. The apparatus of claim 1, the logic to associate the analytical services package with a regulatory certificate.

9. A method, comprising:
   performing an analytical service on a primary analytical device, wherein the analytical service comprises an analytical method for a sample analysis and process information associated with for performing the analytical method on the primary analytical device,
   receiving acceptance of the analytical service in response to determining that the analytical service operates correctly on the primary analytical device, and
   generating an analytical services package for the analytical service, the analytical services package configured to facilitate performance of the analytical service on a client analytical device that has a reduced number of options or configurations as compared to the primary analytical device, the analytical services package comprising a status of the analytical service, the status comprising an approval status of the analytical service that includes a type of use for which the analytical service is approved.

10. The method of claim 9, at least a portion of the analytical services package is immutable.

11. The method of claim 9, the primary analytical device comprising a liquid chromatography (LC) device.

12. The method of claim 9, the primary analytical device comprising a mass spectrometer (MS) device.

13. The method of claim 9, the analytical services package comprising a security level of an operator permitted to run the analytical service.

14. The method of claim 9, comprising:
   accessing the analytical services package, and
   providing the analytical services package to the client analytical device for performance of the analytical service on the client device.

15. The method of claim 9, comprising setting an acceptance variable of the analytical services package to an accepted value responsive to acceptance of the analytical services package.

16. The method of claim 9, comprising associating the analytical services package with a regulatory certificate.

17. The apparatus of claim 1, wherein the type of use comprises one or more of:
   a use to evaluate the performance of the analytical service,
   a clinical use,
   an in-vitro diagnostics use,
   a research use, or
   a regulatory use indicating that the analytical service is meets a requirement of a regulatory body or indicating that the analytical service does not meet the requirement of the regulatory body.

* * * * *